(12) United States Patent
Teraguchi

(10) Patent No.: US 11,705,070 B2
(45) Date of Patent: *Jul. 18, 2023

(54) DISPLAY APPARATUS AND ELECTRONIC APPARATUS

(71) Applicant: Sony Group Corporation, Tokyo (JP)

(72) Inventor: Shinichi Teraguchi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,427

(22) Filed: Feb. 17, 2022

(65) Prior Publication Data

US 2022/0351684 A1 Nov. 3, 2022

Related U.S. Application Data

(63) Continuation of application No. 16/928,484, filed on Jul. 14, 2020, now Pat. No. 11,282,460, which is a
(Continued)

(30) Foreign Application Priority Data

Jun. 20, 2016 (JP) .............................. JP2016-121372

(51) Int. Cl.
*G09G 3/30* (2006.01)
*G09G 3/3258* (2016.01)
(Continued)

(52) U.S. Cl.
CPC ......... *G09G 3/3258* (2013.01); *G09G 3/3233* (2013.01); *H10K 59/123* (2023.02);
(Continued)

(58) Field of Classification Search
CPC ...... G09G 3/30; G09G 3/3208; G09G 3/3233; G09G 3/3225; G09G 3/3291;
(Continued)

(56) References Cited

U.S. PATENT DOCUMENTS 9,111,492 B2 * 8/2015 Kim ..................... G09G 3/3283
9,727,186 B2 * 8/2017 Yang ..................... G06F 3/0412
(Continued)

FOREIGN PATENT DOCUMENTS

CN 1770247 A 5/2006
CN 101281715 A 10/2008
(Continued)

OTHER PUBLICATIONS

Japanese Office Action dated Mar. 23, 2021 for corresponding Japanese Application No. 2018-523587.
(Continued)

*Primary Examiner* — Michael J Eurice
(74) *Attorney, Agent, or Firm* — Michael Best & Friedrich LLP

(57) ABSTRACT

A display apparatus according to the present disclosure includes: a pixel array unit, pixels being arranged in the pixel unit, the pixels each including a driving transistor that includes a plurality of gate electrodes and drives a light emitting unit in response to a video signal applied to one gate electrode of the plurality of gate electrodes; and a control unit that controls gate voltage of a different gate electrode of the driving transistor. Further, an electronic apparatus according to the present disclosure includes the display apparatus having the above-mentioned configuration.

20 Claims, 13 Drawing Sheets

Related U.S. Application Data continuation of application No. 16/066,112, filed as application No. PCT/JP2017/018079 on May 12, 2017, now Pat. No. 10,748,486.

(51) Int. Cl.

| | | |
|---|---|---|
| *G09G 3/3233* | (2016.01) | |
| *H10K 59/123* | (2023.01) | |
| G09G 3/3208 | (2016.01) | |
| H10K 59/121 | (2023.01) | |

(52) U.S. Cl.
CPC ...... *G09G 3/3208* (2013.01); *G09G 2300/0819* (2013.01); *G09G 2300/0852* (2013.01); *G09G 2300/0861* (2013.01); *G09G 2310/0251* (2013.01); *G09G 2310/0262* (2013.01); *G09G 2310/0264* (2013.01); *G09G 2320/0219* (2013.01); *G09G 2320/0233* (2013.01); *G09G 2320/043* (2013.01); *H10K 59/1213* (2023.02)

(58) Field of Classification Search
CPC ..... G09G 2300/0819; G09G 2300/0866; G09G 2310/061; G09G 2320/043; G09G 2320/045; H01L 24/42316; H01L 27/124; H01L 27/1251; H01L 27/15; H01L 27/3274; H01L 29/785; H01L 29/7855; H01L 29/78642; H01L 29/78645; H01L 51/0554; H01L 78/31; H01L 2029/7858
See application file for complete search history.

(56) References Cited

U.S. PATENT DOCUMENTS

| | | |
|---|---|---|
| 2002/0195968 A1 | 12/2002 | Sanford et al. |
| 2003/0142056 A1 | 7/2003 | Okamoto |
| 2004/0090186 A1 | 5/2004 | Yoshida et al. |
| 2004/0174349 A1 | 9/2004 | Libsch et al. |
| 2005/0082966 A1 | 4/2005 | Yamazaki et al. |
| 2005/0168490 A1 | 8/2005 | Takahara |
| 2005/0180083 A1 | 8/2005 | Takahara et al. |
| 2005/0212787 A1 | 9/2005 | Noguchi et al. |
| 2005/0243037 A1 | 11/2005 | Eom et al. |
| 2006/0066512 A1 | 3/2006 | Afentakis et al. |
| 2006/0071887 A1 | 4/2006 | Chou |
| 2007/0052647 A1 | 3/2007 | Chen |
| 2008/0001855 A1 | 1/2008 | Hamer et al. |
| 2008/0165302 A1 | 7/2008 | Yasui et al. |
| 2008/0231617 A1 | 9/2008 | Miyake et al. |
| 2008/0278464 A1* | 11/2008 | Yamamoto ............ G09G 3/3233 345/204 |
| 2008/0291182 A1 | 11/2008 | Yamashita et al. |
| 2009/0051674 A1 | 2/2009 | Kimura et al. |
| 2009/0109208 A1 | 4/2009 | Yamashita et al. |
| 2009/0184902 A1 | 7/2009 | Tomida et al. |
| 2010/0259527 A1* | 10/2010 | Odawara ............ G09G 3/3233 345/76 |
| 2011/0063283 A1* | 3/2011 | Ryu .................... G09G 3/3283 345/76 |
| 2011/0109660 A1* | 5/2011 | Kim .................... G09G 3/3233 345/77 |
| 2011/0122324 A1 | 5/2011 | Yamashita et al. |
| 2011/0234925 A1 | 9/2011 | Tatara et al. |
| 2011/0273419 A1* | 11/2011 | Park .................... G09G 3/3233 345/76 |
| 2011/0279444 A1* | 11/2011 | Chung ................. G09G 3/3233 345/214 |
| 2012/0249510 A1 | 10/2012 | Jankovic et al. |
| 2012/0256554 A1 | 10/2012 | Um et al. |
| 2012/0327058 A1 | 12/2012 | Minami et al. |
| 2013/0169699 A1* | 7/2013 | Jeong ................... G09G 3/3225 345/690 |
| 2013/0278166 A1 | 10/2013 | Katoh |
| 2014/0085561 A1 | 3/2014 | Takatori |
| 2014/0139569 A1 | 5/2014 | Yamashita et al. |
| 2014/0306945 A1 | 10/2014 | Kishi |
| 2014/0333680 A1* | 11/2014 | Choi .................... H05B 45/60 315/307 |
| 2015/0029171 A1* | 1/2015 | Jo ....................... G09G 3/3258 345/82 |
| 2015/0179105 A1 | 6/2015 | Mizukoshi |
| 2015/0243218 A1 | 8/2015 | Tseng et al. |
| 2015/0279272 A1 | 10/2015 | Takahara |
| 2015/0379923 A1* | 12/2015 | Lee ..................... H01L 27/3272 345/82 |
| 2016/0042694 A1* | 2/2016 | Lim ..................... G09G 3/3233 345/78 |
| 2016/0064411 A1 | 3/2016 | Park et al. |
| 2016/0246409 A1* | 8/2016 | Yang ................... G09G 3/3225 |
| 2017/0018224 A1* | 1/2017 | Lee .................... G09G 3/3291 |
| 2017/0031485 A1* | 2/2017 | Kim ................... G06F 3/04184 |
| 2017/0061877 A1* | 3/2017 | Lee .................... G09G 3/3258 |
| 2017/0061892 A1* | 3/2017 | Jung .................. G09G 3/3291 |
| 2017/0069664 A1 | 3/2017 | Nakamura et al. |
| 2017/0116918 A1* | 4/2017 | Dong .................. G09G 3/20 |
| 2017/0316738 A1 | 11/2017 | Sohn |
| 2017/0345368 A1* | 11/2017 | Kim ................... G09G 3/3233 |
| 2017/0365213 A1 | 12/2017 | Rieutort-Louis et al. |
| 2017/0365214 A1 | 12/2017 | Tsai et al. |
| 2018/0061293 A1* | 3/2018 | Park .................... G09G 3/006 |
| 2018/0190194 A1* | 7/2018 | Zhu .................... H01L 27/12 |
| 2019/0355802 A1* | 11/2019 | Shim .................. G09G 3/3225 |

FOREIGN PATENT DOCUMENTS

| | | |
|---|---|---|
| CN | 101312012 A | 11/2008 |
| CN | 102074186 A | 5/2011 |
| CN | 105225633 A | 1/2016 |
| CN | 105573549 A | 5/2016 |
| JP | 2008-287141 A | 11/2008 |
| JP | 2009251205 A | 10/2009 |
| JP | 2011112723 A | 6/2011 |
| JP | 2011209434 A | 10/2011 |
| JP | 2012255872 A | 12/2012 |
| JP | 2013003568 A | 1/2013 |
| JP | 2013076994 A | 4/2013 |
| JP | 2015014764 A | 1/2015 |
| JP | 2015034861 A | 2/2015 |
| KR | 20110109851 A | 10/2011 |
| KR | 20150098616 A | 8/2015 |
| WO | 2014/103500 A1 | 7/2014 |

OTHER PUBLICATIONS

Korean Office Action dated Mar. 24, 2021 for corresponding Korean Application No. 10-2018-7020153.

Chinese Office Action dated May 6, 2021 for corresponding Chinese Application No. 2017800079763.

Korean Office Action dated Dec. 30, 2021 for corresponding Korean Application No. 10-2018-7020153.

\* cited by examiner

FIG.3A
Effect on odd-numbered/even-numbered rows due to angled ion implantation
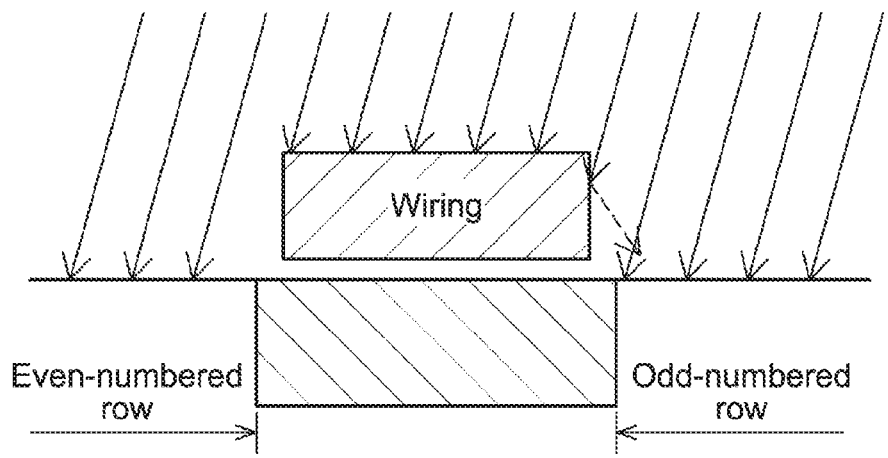
FIG.3B
Horizontal stripes in odd-numbered/even-numbered row
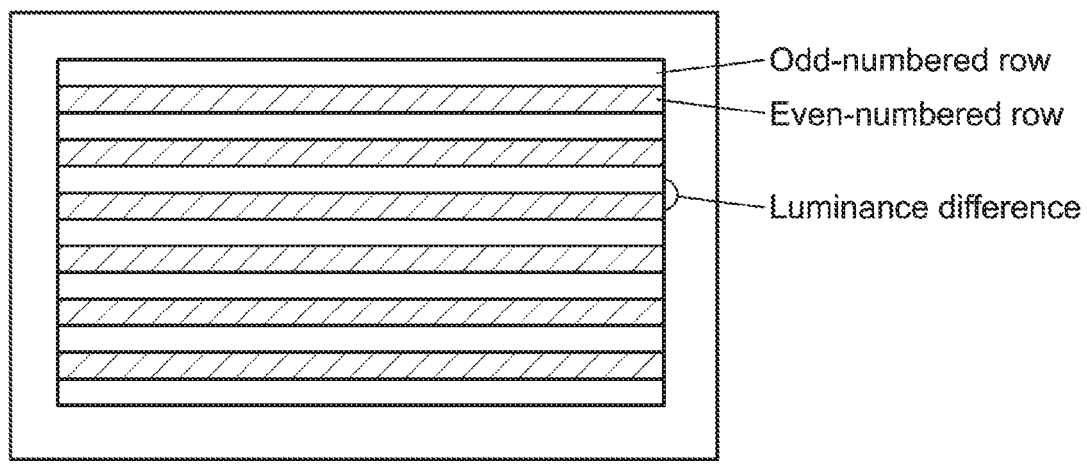
FIGS.3

FIG.4A
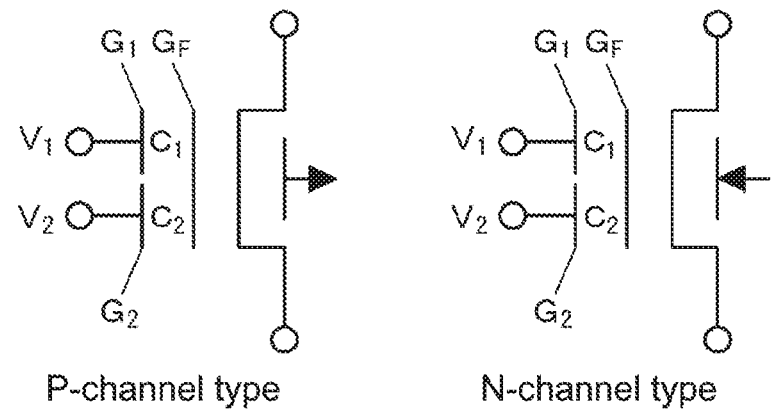
P-channel type    N-channel type
FIG.4B
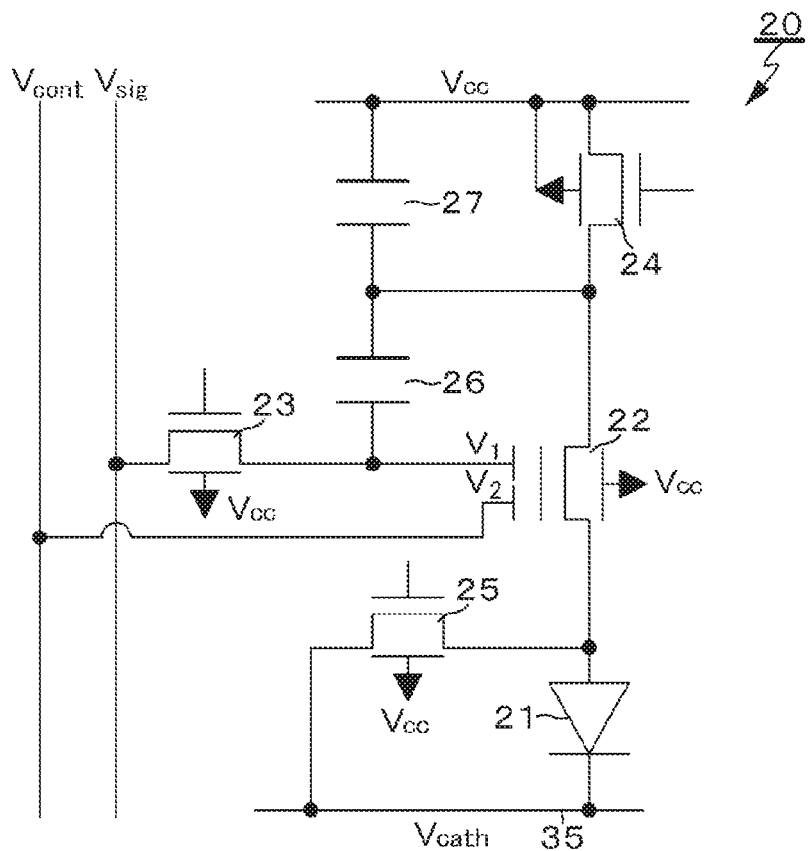
FIGS.4

FIG.12A
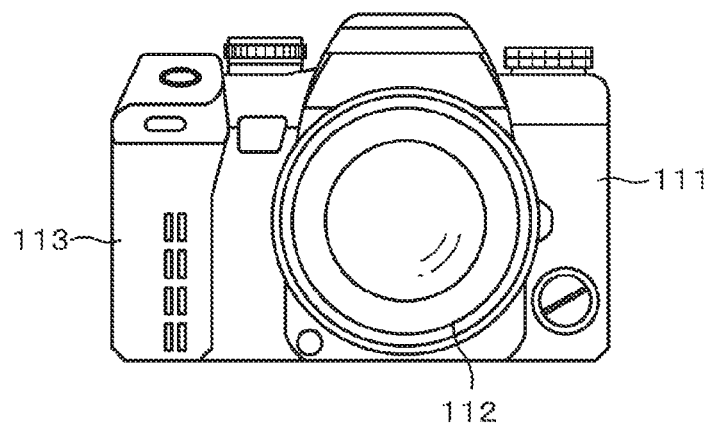
FIG.12B
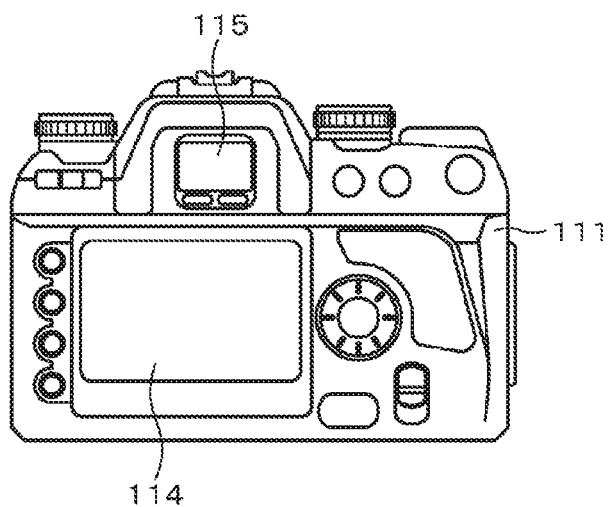
FIGS.12

DISPLAY APPARATUS AND ELECTRONIC APPARATUS

CROSS REFERENCE TO RELATED APPLICATIONS

This application is a continuation of U.S. application Ser. No. 16/928,484, filed Apr. 14, 2020 which is a continuation application of application Ser. No. 16/066,112, filed Jul. 26, 2018 and claims priority to Japanese Priority Patent No. 2016-121372 filed Jun. 20, 2016 and the entire contents of which are incorporated herein by reference.

TECHNICAL FIELD

The present disclosure relates to a display apparatus and an electronic apparatus, and particularly to a flat display apparatus in which pixels each including a light emitting unit are arranged in a matric pattern, and an electronic apparatus including the display apparatus.

BACKGROUND ART

As one of flat (flat panel) display apparatuses, for example, there is an organic EL display apparatus using, as a light emitting unit (light emitting device), an organic EL device that uses the phenomenon of light emission when applying an electric field to an organic thin film by using electroluminescence (EL) of an organic material.

In the flat display apparatus typified by this organic EL display apparatus, when the characteristics (threshold voltage, mobility, and the like) of a driving transistor that drives the light emitting unit differ for each pixel, the value of current flowing through the driving transistor varies between the pixels. As a result, even when the same voltage is applied to the gate electrode of the driving transistor between the pixels, the light emission luminance of the light emitting unit varies between the pixels, which impairs the uniformity of a screen.

Therefore, each pixel of the flat display apparatus typified by the organic EL display apparatus has a threshold voltage correction function of correcting variations in the characteristics, e.g., variations in a threshold voltage $V_{th}$, of the driving transistor driving the light emitting unit in units of pixels (see, for example, Patent Literature 1).

CITATION LIST

Patent Literature

Patent Literature 1: Japanese Patent Application Laid-open No. 2008-287141

DISCLOSURE OF INVENTION

Technical Problem

In the above-mentioned correction function of correcting the variation in the characteristics of the driving transistor, correction is performed in units of pixels. In such a correction function according to the related art, for example, it is difficult to achieve a sufficient improvement effect for partial deterioration of the uniformity in the screen.

It is an object of the present disclosure to provide a display apparatus and an electronic apparatus including the display apparatus that are capable of improving partial deterioration of the uniformity that cannot be handled with the function of correction performed in units of pixels.

Solution to Problem

In order to achieve the above-mentioned object, a display apparatus according to the present disclosure is characterized by including:
a pixel array unit, pixels being arranged in the pixel unit, the pixels each including a driving transistor that includes a plurality of gate electrodes and drives a light emitting unit in response to a video signal applied to one gate electrode of the plurality of gate electrodes; and
a control unit that controls gate voltage of a different gate electrode of the driving transistor. Further, in order to achieve the above-mentioned object, an electronic apparatus according to the present disclosure is characterized by including the display apparatus having the above-mentioned configuration.

In the display apparatus or electronic apparatus having the above-mentioned configuration, threshold voltage of the driving transistor can be corrected by controlling the gate voltage of the different gate electrode of the driving transistor. Accordingly, it is possible to achieve partial correction in the screen for the threshold voltage of the driving transistor.

Advantageous Effects of Invention

According to the present disclosure, since partial correction in the screen can be achieved for the threshold voltage of the driving transistor, it is possible to improve partial deterioration of the uniformity that cannot be handled with the function of correction performed in units of pixels.

It should be noted that the effect described here is not necessarily limitative and may be any effect described in the present disclosure. Further, the effects described herein are merely examples and are not limited, and additional effects may be provided.

BRIEF DESCRIPTION OF DRAWINGS

FIG. 3A is an explanatory diagram for the effect on odd-numbered/even-numbered pixel rows due to angled ion implantation, and FIG. 3B is an explanatory diagram for partial deterioration of the uniformity in a screen, e.g., horizontal stripes that occur due to the luminance difference between odd-numbered/even-numbered pixel rows.

FIG. 4A is an equivalent circuit diagram showing a transistor having a neuron MOS structure, and FIG. 4B is a circuit diagram of a pixel using a transistor having a neuron MOS structure as a driving transistor.

FIG. 12 is an outer appearance view of a digital still camera of a lens-interchangeable and single-lens-reflex type, FIG. 12A shows a front view thereof, and FIG. 12B shows a rear view thereof.

MODE(S) FOR CARRYING OUT THE INVENTION

Figure 1:
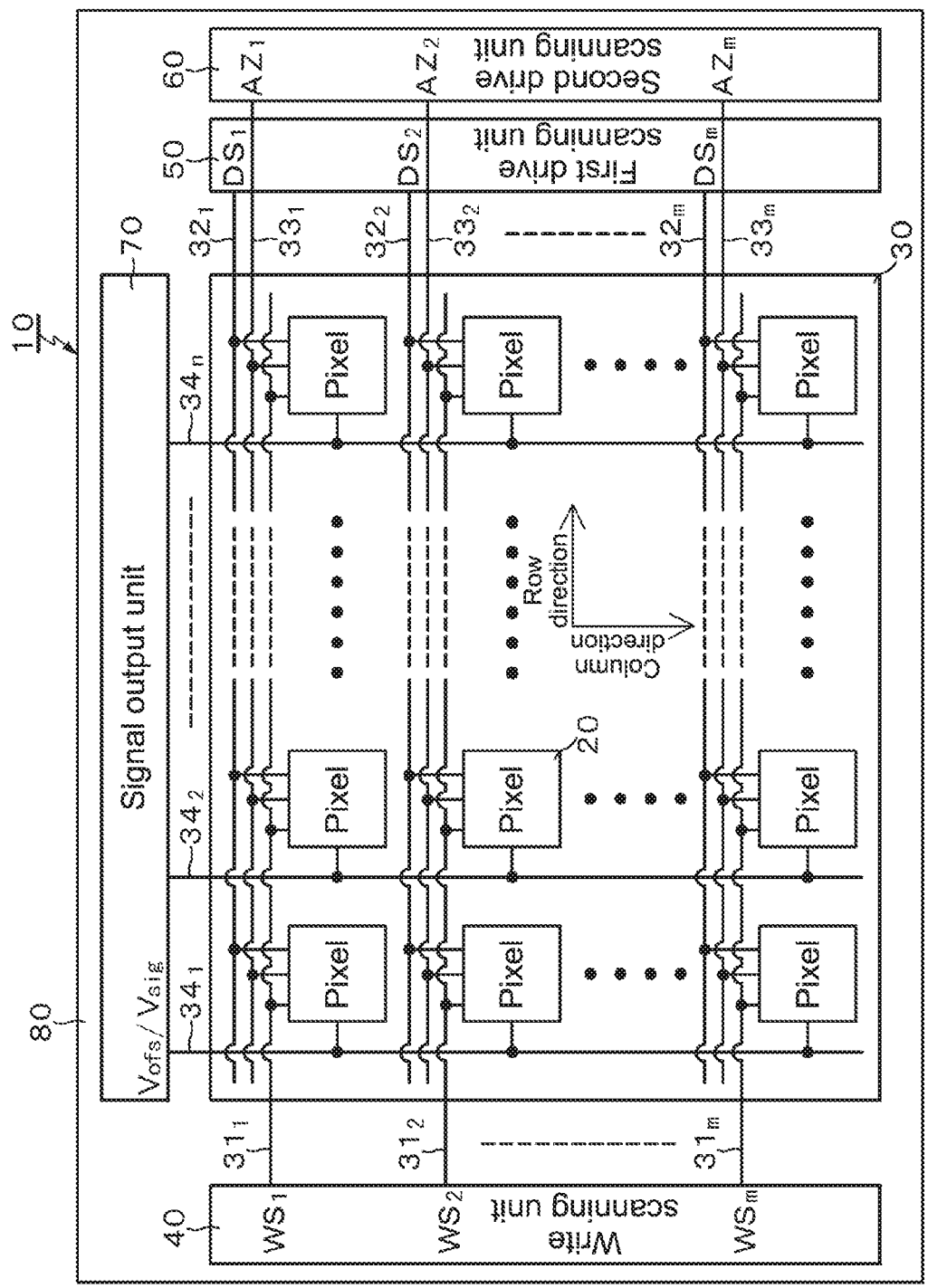
FIG. 1 is a system configuration diagram schematically showing a specific configuration of an active matrix display apparatus to which the technology of the present disclosure is applied.

Hereinafter, embodiments for carrying out the technology of the present disclosure (hereinafter, referred to as "embodiments") will be described in detail with reference to the drawings. The technology of the present disclosure is not limited to the embodiments, and various numerical values, materials, and the like in the embodiments are merely examples. In the following description, the same components or components having the same function will be denoted by the same reference symbols, and duplicate description will be omitted. Note that descriptions will be made in the following order.

1. Display Apparatus and Electronic Apparatus according to Present Disclosure, General Description
2. Display Apparatus to which Technology of Present Disclosure Is Applied
   2-1. System Configuration
   2-2. Pixel Circuit
   2-3. Basic Circuit Operation
   2-4. Partial Deterioration of Uniformity in Screen
3. Embodiment of Present Disclosure
   3-1. Transistor Having Neuron MOS Structure
      3-1-1. Device Structure
      3-1-2. Operational Principal
   3-2. Example 1 (Example of Countermeasure against Horizontal Stripes: Example of Using Neuron MOS)
   3-3. Example 2 (Modified Example of Example 1)
   3-4. Example 3 (Modified Example of Example 1/Example 2)
   3-5. Example 4 (Modified Example of Example 1: Example of Controlling Back Gate)
   3-6. Example 5 (Modified Example of Example 1: Example of controlling One of Dual Gate)
4. Modified Example
5. Electronic Apparatus
   5-1. Specific Example 1 (Example of Digital Still Camera)
   5-2. Specific Example 2 (Example of Head Mounted Display)
6. Configuration of Present Disclosure <Display Apparatus and Electronic Apparatus According to Present Disclosure, General Description>

In a display apparatus and an electronic apparatus according to the present disclosure, a control unit may be configured to threshold voltage of the driving transistor by controlling the gate voltage of the different gate electrode. Further, the control unit may apply predetermined direct current voltage to the different gate electrode as control voltage. The different gate electrode may be a back gate, or one of gate electrodes of a dual-gate structure.

In the display apparatus and electronic apparatus according to the present disclosure including the above-mentioned favorable configuration, the control unit may be configured to control the gate voltage of the different gate electrode in units of pixel rows of the pixel array unit. Further, the pixels each including the driving transistor that includes the plurality of gate electrodes may be arranged in even-numbered pixel rows, odd-numbered pixel rows, or all the pixel rows of the pixel array unit, and the control unit may be configured to control the gate voltage of the different gate electrode in only the even-numbered pixel rows or the odd-numbered rows, or in the all pixel rows.

Further, in the display apparatus and electronic apparatus according to the present disclosure including the above-mentioned favorable configuration, the pixels may each have a threshold voltage correction function of using, as a reference, initialization voltage of the gate electrode, to which the video signal is applied, of the driving transistor, and changing source voltage of the driving transistor toward voltage obtained by subtracting the threshold voltage of the driving transistor from the initialization voltage. Further, the light emitting unit may include an organic electroluminescence device.

<Display Apparatus to which Technology of Present Disclosure is Applied>

[System Configuration]

First, a display apparatus to which the technology of the present disclosure is applied, more specifically, an active matrix display apparatus will be described. FIG. 1 is a system configuration diagram schematically showing a specific configuration of an active matrix display apparatus to which the technology of the present disclosure is applied.

The active matrix display apparatus is a display apparatus that controls current flowing through an electro-optical device by an active device, e.g., an insulated gate field effect transistor, provided in a pixel circuit that includes the electro-optical device. Typical examples of the insulated gate field effect transistor include a MOS transistor and a TFT (Thin Film Transistor).

Here, an active matrix organic EL display apparatus using an organic EL device will be described as an example of a light emitting unit (light emitting device) of the pixel circuit. The organic EL device is a current drive type electro-optical device (self-light emitting device) in which the light emission luminance is changed depending on the value of current flowing through the device.

As shown in FIG. 1, an organic EL display apparatus 10 to which the technology of the present disclosure is applied includes a pixel array unit 30 in which a plurality of pixels 20 each including an organic EL device are two-dimensionally arranged in a matrix pattern, and a driving circuit unit located around the pixel array unit 30. The driving circuit unit includes, for example, a write scanning unit 40, a first drive scanning unit 50, a second drive scanning unit 60, a signal output unit 70, and the like mounted on a display panel 80 that includes the pixel array unit 30, and drives each of the pixels 20 of the pixel array unit 30. Note that some or all of the write scanning unit 40, the first drive scanning unit 50, the second drive scanning unit 60, and the signal output unit 70 may be provided outside the display panel 80.

Here, in the case where the organic EL display apparatus 10 supports color display, one pixel (unit pixel) as a unit for forming a color image includes a plurality of sub-pixels. In this case, each of the sub-pixels corresponds to the pixel 20 in FIG. 1. More specifically, in the display apparatus that supports color display, one pixel includes, for example, three sub-pixels, i.e., a sub-pixel that emits red (R) light, a sub-pixel that emits green (G) light, and a sub-pixel that emits blue (B) light.

However, the one pixel is not limited to the combination of sub-pixels of three primary colors (RGB), and one pixel may be configured by adding a sub-pixel of one color or sub-pixels of a plurality of colors to the sub-pixels of three primary colors. More specifically, for example, one pixel may be configured by adding a sub-pixel that emits white (W) light in order to improve the luminance, or one pixel may be configured by adding at least one sub-pixel that emits light of a complementary color in order to enlarge the color reproduction range.

In the pixel array unit 30, with respect to the arrangement of the pixels 20 in m rows and n columns, scanning lines 31 ($31_1$ to $31_m$), first driving lines 32 ($32_1$ to $32_m$), and second driving lines 33 ($33_1$ to $33_m$) are wired for the corresponding pixel rows along the row direction (arrangement direction of the pixels in the pixel rows). Further, with respect to the arrangement of the pixels 20 in m rows and n columns, signal lines 34 ($34_1$ to $34_n$) are wired for the corresponding pixel columns along the column direction (arrangement direction of the pixels in the pixel columns).

The scanning lines $31_1$ to $31_m$ are respectively connected to the output terminal in the corresponding row of the write scanning unit 40. The first driving lines $32_1$ to $32_m$ are respectively connected to the output terminal in the corresponding row of the first drive scanning unit 50. The second driving lines $33_1$ to $33_m$ are respectively connected to the output terminal in the corresponding row of the second drive scanning unit 60. The signal lines $34_1$ to $34_n$ are respectively connected to the output terminal in the corresponding column of the signal output unit 70.

The write scanning unit 40 includes a shift register circuit and the like. This write scanning unit 40 performs, when writing signal voltage of a video signal to each pixel 20 of the pixel array unit 30, so-called line sequential scanning that scans each pixel 20 of the pixel array unit 30 in units of rows in a sequential order by sequentially supplying write scanning signals WS ($WS_1$ to $WS_m$) to the scanning lines 31 ($31_1$ to $31_m$).

The first drive scanning unit 50 includes a shift register circuit and the like, similarly to the write scanning unit 40. This first drive scanning unit 50 controls light emission/non-light emission (turning-off) of the pixels 20 by supplying first control signals DS ($DS_1$ to $DS_m$) to the first driving lines 32 ($32_1$ to $32_m$) in synchronization with the line sequential scanning performed by the write scanning unit 40.

The second drive scanning unit 60 includes a shift register circuit and the like, similarly to the write scanning unit 40. This second drive scanning unit 60 performs control of causing the pixels 20 not to emit light in the non-light emission period by supplying second control signals AZ ($AZ_1$ to $AZ_m$) to the second driving lines 33 ($33_1$ to $33_m$) in synchronization with the line sequential scanning performed by the write scanning unit 40.

The signal output unit 70 selectively outputs signal voltage $V_{sig}$ of the video signal that depends on the luminance information supplied from a signal supply source (not shown) (hereinafter, referred to simply as "signal voltage" in some cases), and reference voltage $V_{ofs}$. Here, the reference voltage $V_{ofs}$ is voltage (e.g., voltage corresponding to the black level of the video signal) as a reference of the signal voltage $V_{sig}$ of the video signal or voltage close to that, and used as initialization voltage in a threshold voltage correction operation to be described later.

The signal voltage $V_{sig}$/the reference voltage $V_{ofs}$ alternatively output from the signal output unit 70 are written to the pixel 20 of the pixel array unit 30 via the signal lines 34 ($34_1$ to $34_n$) in units of pixel rows selected by the line sequential scanning performed by the write scanning unit 40. That is, the signal output unit 70 adopts a driving mode of line sequential writing in which the signal voltage $V_{sig}$ is written in units of pixel rows (lines).

[Pixel Circuit]

Figure 2:
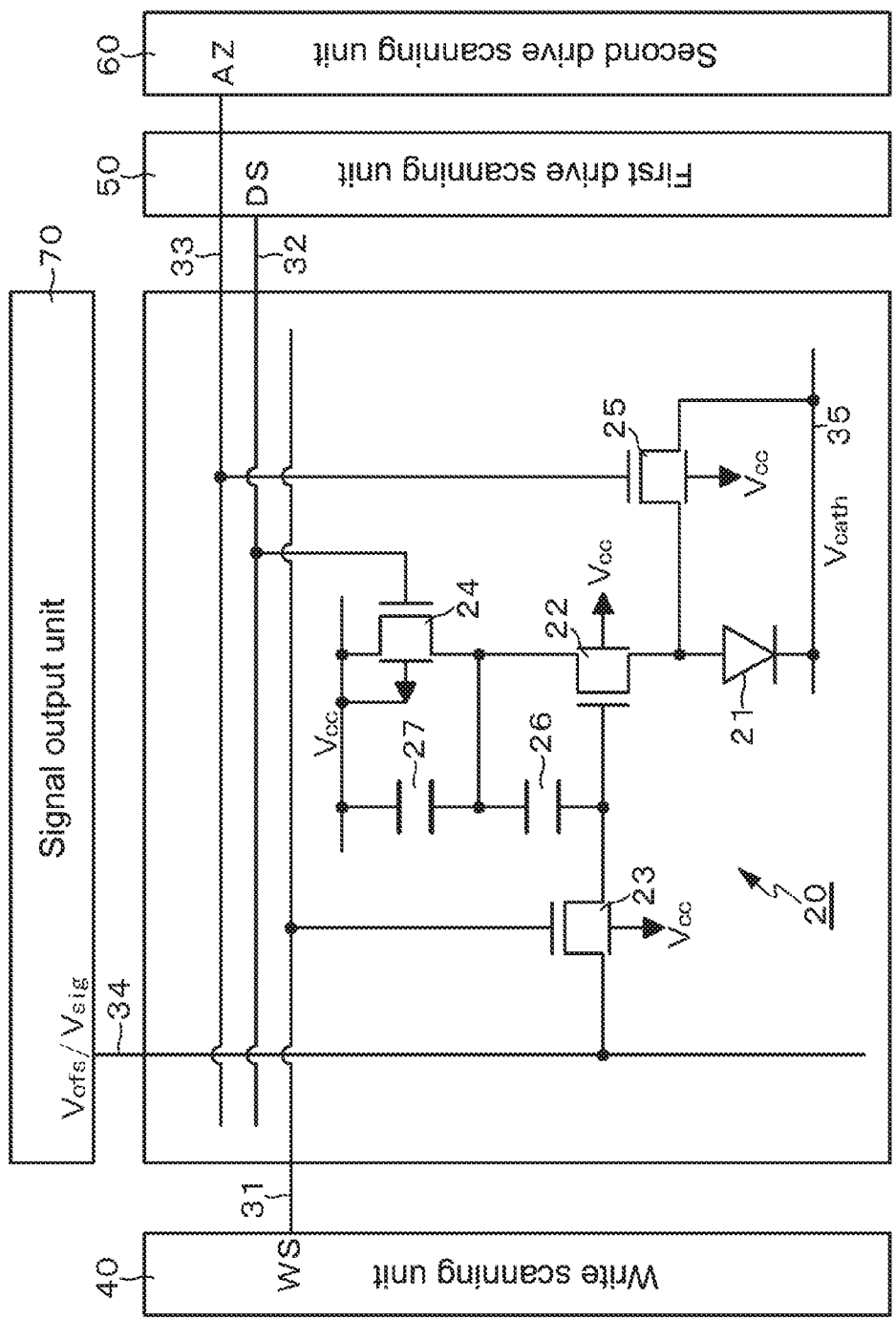
FIG. 2 is a circuit diagram showing a circuit example of a pixel in the active matrix display apparatus to which the technology of the present disclosure is applied.

FIG. 2 is a circuit diagram showing a circuit example of the pixel (pixel circuit) 20 in the active matrix display apparatus to which the technology of the present disclosure is applied. The light emitting unit of the pixel 20 includes an organic EL device (organic electroluminescence device) 21 as a self-light emitting device.

As shown in FIG. 2, the pixel 20 includes the organic EL device 21 and a driving circuit that drives the organic EL device 21 by applying current to the organic EL device 21. A cathode electrode of the organic EL device 21 is connected to a cathode wiring 35 as a common power source line wired in common for all the pixels 20.

The driving circuit of the organic EL device 21 includes a driving transistor 22, a write transistor 23, a light emission control transistor 24, a switching transistor 25, a holding capacitance 26, and an auxiliary capacitance 27. Here, devices constituting the pixel 20, i.e., the organic EL device 21, the driving transistor 22, the write transistor 23, the light emission control transistor 24, the switching transistor 25, the holding capacitance 26, and the auxiliary capacitance 27 are formed on a semiconductor substrate such as a silicon single crystalline substrate, as an example.

The driving transistor 22, the write transistor 23, the light emission control transistor 24, and the switching transistor 25 each include a P-channel transistor, and have a structure of not three, i.e., source/gate/drain terminals but four, i.e., source/gate/drain/back gate terminals. In addition, to the back gates of the transistors 22 to 25, power source voltage $V_{cc}$ is applied.

In the pixel 20 having the above-mentioned configuration, the write transistor 23 writes, by sampling the signal voltage $V_{sig}$ supplied from the signal output unit 70 via the signal line 34, the signal voltage $V_{sig}$ to the gate electrode of the driving transistor 22. The light emission control transistor 24 is connected between the power source line of the power source voltage $V_{cc}$ and the source electrode of the driving transistor 22, and controls light emission/non-light emission of the organic EL device 21 under the driving by the first control signals DS. The switching transistor 25 is connected between the drain electrode of the driving transistor 22 and a current discharge destination node (e.g., the cathode wiring 35), and performs control of causing the organic EL device 21 not to emit light in the non-light emission period under the driving by the second control signals AZ.

The holding capacitance 26 is connected between the gate electrode and the source electrode of the driving transistor 22, and holds the signal voltage $V_{sig}$ written by the write transistor 23. The driving transistor 22 drives the organic EL device 21 by applying driving current that depends on the holding voltage of the holding capacitance 26 to the organic EL device 21. The auxiliary capacitance 27 is connected between the source electrode of the driving transistor 22 and a node having a fixed potential (e.g., the power source line of the power source voltage $V_{cc}$).

[Basic Circuit Operation]

Now, the basic circuit operation of the pixel 20 in the active matrix organic EL display apparatus 10 having the above-mentioned configuration will be described.

Note that since the write transistor 23, the light emission control transistor 24, and the switching transistor 25 are each a P-channel transistor, the low level state and the high level state of each of the write scanning signal WS, the first control signal DS, and the second control signal AZ are an active state and a non-active state, respectively. Further, the write transistor 23, the light emission control transistor 24, and the switching transistor 25 are each in a conductive state and a non-conductive state when the write scanning signal WS, the first control signal DS, and the second control signal AZ are in the active state and the non-active state, respectively.

First, while the reference voltage $V_{ofs}$ is output from the signal output unit 70 to the signal line 34, the write scanning signal WS becomes in the active state and the write transistor 23 becomes in the conductive state, so that the reference voltage $V_{ofs}$ is written to the gate electrode. Accordingly, gate voltage $V_g$ of the driving transistor 22 becomes the reference voltage $V_{ofs}$.

Further, at the timing of writing the reference voltage $V_{ofs}$, the first control signal DS is in a low level state and the light emission control transistor 24 is in the conductive state. As a result, source voltage $V_s$ of the driving transistor 22 becomes the power source voltage $V_{cc}$. At this time, the gate-source voltage $V_{gs}$ of the driving transistor 22 satisfies the relationship of $V_{gs}=V_{ofs}-V_{cc}$.

Here, in order to perform a threshold voltage correction operation (threshold voltage correction processing) to be described later, the gate-source voltage $V_{gs}$ of the driving transistor 22 needs to be made larger than the threshold voltage $V_{th}$ of the driving transistor 22. For that reason, each voltage value is set so that the relationship of $|V_{gs}|=|V_{ofs}-V_{cc}|>|V_{th}|$ is satisfied.

As described above, the initialization operation of setting the gate voltage $V_g$ of the driving transistor 22 to the reference voltage $V_{ofs}$ and the source voltage $V_s$ of the driving transistor 22 to the power source voltage $V_{cc}$ is a preparation (threshold voltage correction preparation) operation before performing the next threshold voltage correction operation. Therefore, the reference voltage $V_{ofs}$ and the power source voltage $V_{cc}$ are initialization voltage of the gate voltage $V_g$ of the driving transistor 22 and initialization voltage of the source voltage $V_s$ of the driving transistor 22, respectively.

Next, when the first control signals DS becomes in the non-active state and the light emission control transistor 24 becomes in the non-conductive state, the source electrode of the driving transistor 22 becomes in a floating state, and the threshold voltage correction operation is started while the gate voltage $V_g$ of the driving transistor 22 is kept at the reference voltage $V_{ofs}$. That is, the source voltage $V_s$ of the driving transistor 22 starts decreasing toward voltage ($V_g$-$V_{th}$) obtained by subtracting the threshold voltage $V_{th}$ from the gate voltage $V_g$ (=$V_{ofs}$) of the driving transistor 22.

As described above, the operation of changing, by using the initialization voltage $V_{ofs}$ of the gate electrode of the driving transistor 22 as a reference, the source voltage $V_s$ of the driving transistor 22 toward voltage ($V_{ofs}$-$V_{th}$) obtained by subtracting the threshold voltage $V_{th}$ of the driving transistor 22 from the initialization voltage $V_{ofs}$ is the threshold voltage correction operation. When this threshold voltage correction operation progresses, the gate-source voltage $V_{gs}$ of the driving transistor 22 eventually converges to the threshold voltage $V_{th}$ of the driving transistor 22. This voltage corresponding to the threshold voltage $V_{th}$ is held in the holding capacitance 26.

Then, the write scanning signal WS becomes in the non-active state and the write transistor 23 becomes in the non-conductive state, so that the threshold value correction period is finished. After that, the signal voltage $V_{sig}$ of the video signal is output from the signal output unit 70 to the signal line 34, and the potential of the signal line 34 is switched from the reference voltage $V_{ofs}$ to the signal voltage $V_{sig}$.

Next, the write scanning signal WS becomes in the active state, so that the write transistor 23 becomes in the conductive state, samples the signal voltage $V_{sig}$, and then writes the sampled signal voltage $V_{sig}$ to the pixel 20. With this write operation of the signal voltage $V_{sig}$ by the write transistor 23, the gate voltage $V_g$ of the driving transistor 22 becomes the signal voltage $V_{sig}$.

At the time of writing the signal voltage $V_{sig}$ of the video signal, the auxiliary capacitance 27 connected between the source electrode of the driving transistor 22 and the power source line of the power source voltage $V_{cc}$ acts to suppress the change in the source voltage $V_s$ of the driving transistor 22. Then, at the time of driving the driving transistor 22 by the signal voltage $V_{sig}$ of the video signal, the threshold voltage $V_{th}$ of the driving transistor 22 is cancelled out by the voltage corresponding to the threshold voltage $V_{th}$ held in the holding capacitance 26.

At this time, the gate-source voltage $V_{gs}$ of the driving transistor 22 is opened (increased) depending on the signal voltage $V_{sig}$. However, the source voltage $V_s$ of the driving transistor 22 is still in a floating state. For that reason, the charges stored in the holding capacitance 26 are discharged according to the characteristics of the driving transistor 22. Then, by the current flowing through the driving transistor 22 at this time, charging of the equivalent capacitance of the organic EL device 21 is started.

Since the equivalent capacitance of the organic EL device 21 is charged, the source voltage $V_s$ of the driving transistor 22 is gradually decreased as time passes. At this time, the variation in the threshold voltage $V_{th}$ of the driving transistor 22 for each pixel has been cancelled out, and drain-source current $I_{ds}$ of the driving transistor 22 depends on a mobility p of a semiconductor thin film constituting a channel of the driving transistor 22 (hereinafter, referred to simply as "the mobility µ").

Here, the amount of decrease in the source voltage $V_s$ of the driving transistor 22 acts to discharge the charges stored in the holding capacitance 26. In other words, a negative feedback has been applied to the holding capacitance 26 by the amount of decrease (amount of change) in the source voltage $V_s$ of the driving transistor 22. Therefore, the amount of decrease in the source voltage $V_s$ of the driving transistor 22 becomes the feedback amount of the negative feedback.

As described above, by applying a negative feedback to the holding capacitance 26 by the feedback amount depending on the drain-source current $I_{ds}$ flowing through the driving transistor 22, it is possible to cancel out the dependency of the drain-source current $I_{ds}$ of the driving transistor 22 on the mobility p. This canceling operation (canceling processing) is a mobility correction operation (mobility correction processing) of correcting the variation in the mobility µ of the driving transistor 22 for each pixel.

More specifically, since the drain-source current $I_{ds}$ is increase as a signal amplitude $V_{in}(=V_{sig}-V_{ofs})$ of the video signal written to the gate electrode of the driving transistor 22 is larger, also the absolute value of the feedback amount of the negative feedback is increased. Therefore, the mobility correction processing depending on the signal amplitude $V_{in}$ of the video signal, i.e., the light emission luminance level is performed. Further, in the case where the signal amplitude $V_{in}$ of the video signal is kept constant, since the absolute value of the feedback amount of the negative feedback is increased as the mobility p of the driving transistor 22 is larger, it is possible to remove the variation in the mobility p for each pixel.

Then, the write scanning signal WS becomes in the non-active state and the write transistor 23 becomes in the non-conductive state, so that the operation (processing) of writing signal voltage and correcting the mobility is finished. After that, the first control signal DS becomes in the non-active state and the light emission control transistor 24 becomes in the conductive state, so that current is supplied from the power source line of the power source voltage $V_{cc}$ to the driving transistor 22 via the light emission control transistor 24.

At this time, since the write transistor 23 is in the non-conductive state, the gate electrode of the driving transistor 22 is electrically disconnected from the signal line 34 and is in a floating state. Here, in the case where the gate electrode of the driving transistor 22 is in a floating state, since the holding capacitance 26 is connected between the gate/source of the driving transistor 22, the gate voltage $V_g$ is changed in synchronization with the change in the source voltage $V_s$ of the driving transistor 22.

That is, the source voltage $V_s$ and the gate voltage $V_g$ of the driving transistor 22 is increased while maintaining the gate-source voltage $V_{gs}$ held in the holding capacitance 26. Then, the source voltage $V_s$ of the driving transistor 22 is increased to light emission voltage $V_{oled}$ of the organic EL device 21 that depends on the saturation current of the transistor.

As described above, the operation in which the gate voltage $V_g$ of the driving transistor 22 is changed in synchronization with the change in the source voltage $V_s$ is a bootstrap operation. In other words, the bootstrap operation is an operation in which the gate voltage $V_g$ and the source voltage $V_s$ of the driving transistor 22 are changed while maintaining the gate-source voltage $V_{gs}$ held in the holding capacitance 26, i.e., voltage between both ends of the holding capacitance 26.

Then, the drain-source current $I_{ds}$ of the driving transistor 22 starys flowing to the organic EL device 21, so that anode voltage $V_{ano}$ of the organic EL device 21 is increased depending on the voltage $I_{ds}$. When the anode voltage $V_{ano}$ of the organic EL device 21 eventually exceeds threshold voltage $V_{thel}$ of the organic EL device 21, driving current starts flowing to the organic EL device 21. Accordingly, the organic EL device 21 starts emitting light.

Meanwhile, in the non-light emission period of the organic EL device 21, the second drive scanning unit 60 makes the second control signals AZ in the active state and the switching transistor 25 in the conductive state. Since the switching transistor 25 becomes in the conductive state, via the switching transistor 25, the drain electrode of the driving transistor 22 (anode electrode of the organic EL device 21) and the cathode wiring 35 as the current discharge destination node are electrically short-circuited.

Here, the on-resistance of the switching transistor 25 is much smaller than that of the organic EL device 21. Therefore, in the non-light emission period of the organic EL device 21, it is possible to forcibly cause current flowing to the driving transistor 22 to flow to the cathode wiring 35 so that the current does not flow to the organic EL device 21. Incidentally, in one horizontal period in which threshold voltage correction and signal writing are performed, the second control signals AZ becomes in the active state. However, in the subsequent light emission period, the second control signals AZ is in the non-active state.

The above-mentioned organic EL display apparatus 10 using, as a light emitting unit of the pixel 20, the organic EL device 21 that is a self-light emitting device has the following characteristics. That is, the organic EL display apparatus 10 has great expectations as a next-generation display because of the excellent image quality (contrast), advantages for thinning, application and development to a transparent display and a flexible display, and the like as compared with the liquid crystal display apparatus that is the same flat display apparatus. Further, by configuring an organic EL on a semiconductor substrate such as a silicon single crystalline substrate, applications to an electric viewfinder of a digital still camera, a head mounted display as an ultra-small display apparatus have also been started.

Meanwhile, in the organic EL display apparatus 10, the number of constituent devices of the pixel 20 is larger than that of the liquid crystal display apparatus. For example, the pixel 20 shown in FIG. 2 includes the four transistors (22 to 25) and the two capacitive devices (26 and 27) as the constituent devices. When the number of constituent devices of the pixel 20 is large, it is disadvantageous for high definition. From such a viewpoint, particularly, in an organic EL display apparatus formed on a semiconductor substrate, a new twist to cause the wiring or the like for driving the pixel 20 to be shared between adjacent pixel rows in the pixel arrangement, i.e., between the odd-numbered pixel row and the even-numbered pixel row is given. Accordingly, the space of the display area (pixel array unit 30) is compressed to realize high definition.

[Partial Deterioration of Uniformity in Screen]

As described above, in the case of causing the wiring or the like to be shared between the odd-numbered pixel row and the even-numbered pixel row, a mirror-inverted structure in which the pixel structure of the odd-numbered row and the even-numbered row is symmetrical with respect to the boundary line between the odd-numbered row and the even-numbered row is adopted. When the pixel structure of the odd-numbered row and the pixel structure of the even-numbered row are each a mirror-inverted structure as described above, the following phenomena a) and b) occur.

a) In the production process, angled ion implantation shown in FIG. 3A is generally used. A difference (characteristic difference of the driving transistor 22 between the odd-numbered row/the even-numbered row) in the characteristics (threshold voltage, mobility, and the like) of the driving transistor 22 between the odd-numbered row/the even-numbered row occurs due to deviation of ion-implantation in the production process.

b) For example, the coupling potential differs between the odd-numbered row and the even-numbered row due to the shape difference between the pixel structure of the odd-numbered row the pixel structure of the even-numbered row caused by mask deviation or the like (coupling deference depending on the shape of the pixel structure).

As described above, in the general organic EL display apparatus 10, the pixel 20 has a function of correcting the transistor characteristics such as the threshold voltage $V_{th}$ and the mobility p in units of pixels, and improves the uniformity, e.g., vertical stripes, by using this correction function. However, with only the function of correction performed in units of pixels, it is insufficient to improve the uniformity for the effect of the above-mentioned characteristic difference of the driving transistor 22 between the odd-numbered row/the even-numbered row and the above-mentioned coupling difference depending on the shape of the pixel structure. As a result, as shown in FIG. 3B, there is a problem of partial deterioration of the uniformity in the screen, e.g., horizontal stripes that occur due to the luminance difference between the odd-numbered row/the even-numbered row.

EMBODIMENT OF PRESENT DISCLOSURE

In an embodiment of the present disclosure, in order to make it possible to handle with partial deterioration of the uniformity that cannot be handled with the function of correction performed in units of pixels, a transistor including the plurality of gate electrodes is used as the driving transistor 22 of the pixel 20. In addition, the organic EL device 21 is driven by applying a video signal to one gate electrode of the plurality of gate electrodes of the driving transistor 22 while the threshold voltage $V_{th}$ of the driving transistor 22 is corrected by controlling the gate voltage of a different gate electrode of the driving transistor.

Examples of the transistor including the plurality of gate electrodes include a transistor having a neuron MOS structure, and a dual-gate structure in a back gate unit of a MOS transistor or a TFT (thin-film transistor).

[Transistor Having Neuron MOS Structure]

Now, a transistor having a neuron MOS structure will be described. The equivalent circuit of the transistor having a neuron MOS structure is shown in FIG. 4A. In FIG. 4A, the left side shows a P-channel neuron MOS, and the right side shows an N-channel neuron MOS. Further, as the driving transistor 22, a pixel circuit using a transistor having a P-channel neuron MOS structure is shown in FIG. 4B.

(Device Structure)

As shown in FIG. 4A, in the transistor having a neuron MOS structure, the gate electrode is in an electrically floating state, a plurality of gate electrode (two gate electrodes $G_1$ and $G_2$ in this example) are provided on the side opposite to the channel, and these gate electrodes $G_1$ and $G_2$ are capacitively-coupled with a floating gate $G_f$.

Further, in the case where the transistor having a neuron MOS structure is used as the driving transistor 22, as shown in FIG. 4B, assumption is made that the signal voltage $V_{sig}$ is applied as gate voltage $V_1$ of the one gate electrode $G_1$ and control voltage $V_{cont}$ is applied as gate voltage $V_2$ of the other gate electrode $G_2$.

(Operational Principal)

In general, the voltage (floating gate voltage) $\Phi_F$ of the floating gate $G_f$ of the transistor having a neuron MOS structure is given by the weighted linear sum of the gate voltage $V_1, V_2, \ldots, V_n$ of the plurality of gate electrodes $G_1, G_2, \ldots, G_n$ capacitively-coupled with the floating gate $G_f$, as expressed by the following formula (1).

That is, assuming that the capacitances between the floating gate $G_f$ and the gate electrodes $G_1, G_2, \ldots, G_n$ are $C_1, C_2, \ldots, C_n$, the floating gate voltage $\Phi_F$ satisfied the following relationship.

$$\Phi_F = \frac{C_1 V_1 + C_2 V_2 + \ldots\ldots + C_n V_n}{C_{total}} \quad C_{total} = \sum_{i=0}^{n} C_j.$$

Note that $C_{total}$ represents the sum of the capacitances between the floating gate $G_f$ and the gate electrodes $G_1$, $G_2 \ldots, G_n$.

Assuming the input gate of two terminals (gate electrodes) shown in FIG. 4A, the formula (1) is expressed as the following formula (2).

$$\Phi_F = \frac{C_1 V_1 + C_2 V_2}{C_1 + C_2}.$$

When this floating gate voltage $\Phi_F$ exceeds the threshold voltage $V_{th}$ of the transistor, the transistor having a neuron MOS structure becomes in the conductive state. Therefore, the formula (2) can be expressed as the following formula (3).

$$\phi_F = \frac{C_1 V_1 + C_2 V_2}{C_1 + C_2} > V_{th}.$$

When this formula (3) is solved for the gate voltage $V_1$, the following relationship is satisfied.

$$V_1 > \frac{C_1 + C_2}{C_1} V_{th} - \frac{C_2}{C_1} V_2.$$

Note that the formula (3) and the formula (4) are satisfied in the case where the transistor having a neuron MOS structure is an N-channel one.

Further, assuming that the threshold voltage of the transistor as seen from the gate electrode $G_1$ of the gate voltage $V_1$ is $V_{th1}$, the following relationship is established.

$$V_{th1} = \frac{C_1 + C_2}{C_1} V_{th} - \frac{C_2}{C_1} V_2.$$

This shows that it is possible to freely control the threshold voltage $V_{th1}$ of the transistor as seen from the gate electrode $G_1$ of the gate voltage $V_1$ when arbitrary voltage can be applied to the gate electrode $G_2$ as the gate voltage $V_2$.

Hereinafter, a specific example of realizing partial correction in the screen in order to make it possible to handle with partial deterioration of the uniformity that cannot be handled with the function of correction performed in units of pixels will be described.

Example 1

Figure 5:
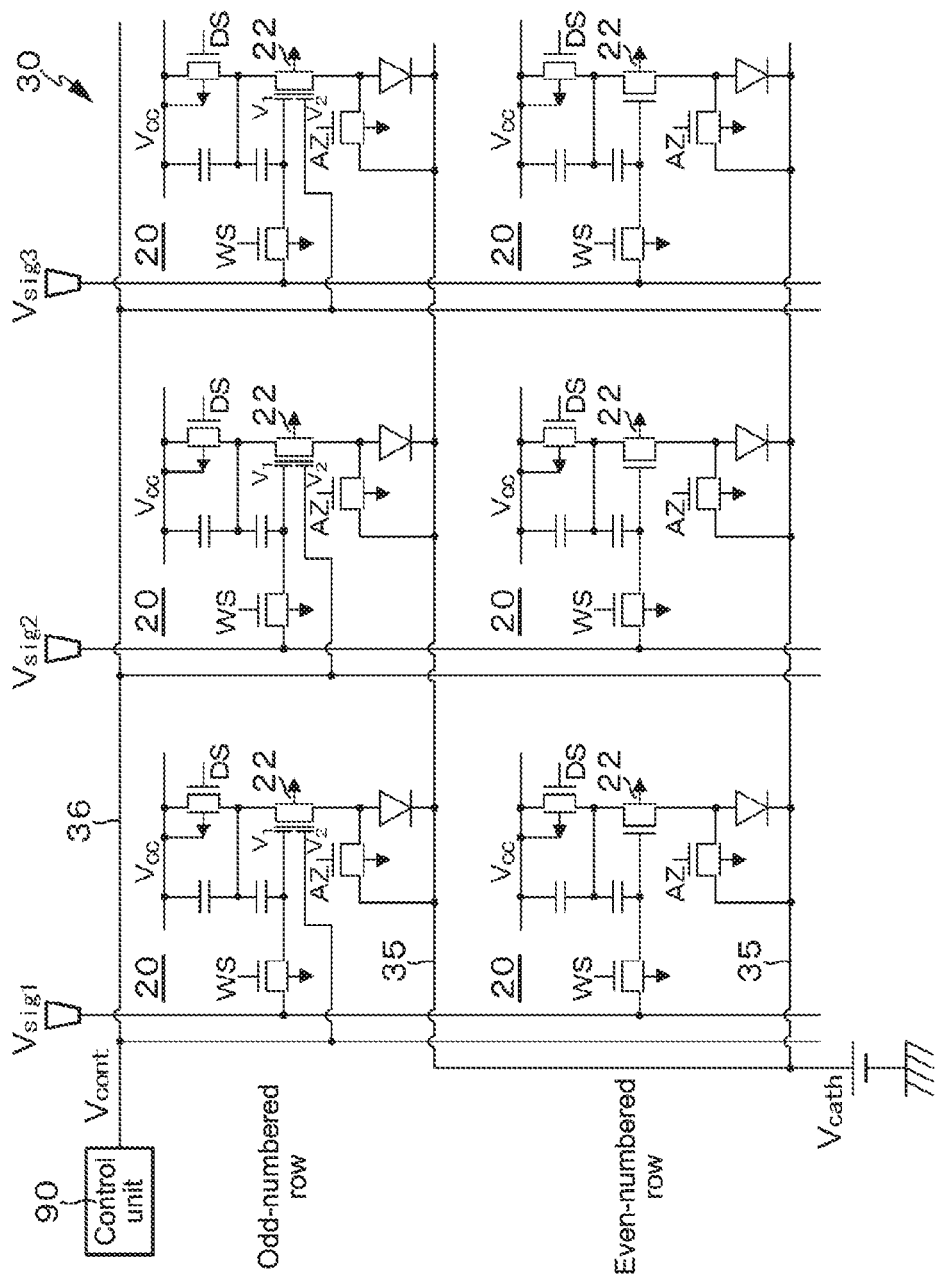
FIG. 5 is a circuit diagram showing a circuit configuration of a main portion of an organic EL display apparatus according to an example 1.

An example 1 is an example of a countermeasure against horizontal stripes that occur due to the luminance difference between the odd-numbered rows/even-numbered rows generated by the characteristic difference of the driving transistor 22 between the odd-numbered rows/even-numbered rows and the coupling difference depending on the shape of the pixel structure. The circuit diagram of the circuit configuration of a main portion of an organic EL display apparatus according to the example 1 is shown in FIG. 5. In FIG. 5, for the sake of simplification of the drawing, the pixels 20 in the pixel arrangement of two rows and three columns are shown for the pixel array unit 30. This also applies to the examples to be described later.

In the example 1, in the pixel arrangement of the pixel array unit 30, the driving transistor 22 of the pixel 20 in the odd-numbered row includes, for example, a transistor having a neuron MOS structure in which two gate electrodes are provided. The driving transistor 22 of the pixel 20 in the even-numbered row includes a normal P-channel transistor.

Further, in the pixel 20 in the odd-numbered row, the signal voltage $V_{sig}$ of a video signal is applied, as the gate voltage $V_1$, to one gate electrode of the driving transistor 22 including a neuron MOS. Further, the control voltage $V_{cont}$ as predetermined direct current voltage is applied, as the gate voltage $V_2$, from a control unit 90 to a different gate electrode of the driving transistor 22 via a control line 36. The control line 36 is commonly wired between the control unit 90 and the pixels 20 in the odd-numbered rows.

The control unit 90 supplies, as the control voltage $V_{cont}$, direct current voltage of such a voltage value that eliminates the luminance difference that occurs between the odd-numbered row/the even-numbered row to the different gate electrode of the driving transistor 22 of the pixel 20 in the odd-numbered row due to the characteristic difference of the driving transistor 22 between the odd-numbered row/the even-numbered row and the coupling difference depending on the shape of the pixel structure. The voltage value of the control voltage $V_{cont}$ is set to such a value that makes the luminance difference between the odd-numbered row/the even-numbered row small, favorably, zero, considering the characteristic difference of the driving transistor 22 between the odd-numbered row/the even-numbered row and the coupling difference depending on the shape of the pixel structure for each organic EL display apparatus 10.

As described above, by using a neuron MOS as the driving transistor 22 of the pixel 20 in the odd-numbered row and controlling the gate voltage $V_2$ of the different gate electrode by the control voltage $V_{cont}$, it is possible to control the threshold voltage $V_{th}$ of the driving transistor 22 as is apparent from the formula (5). Accordingly, since luminance adjustment can be performed for each area (each odd-numbered row in this example) in the screen, it is possible to prevent horizontal stripes from occurring due to the luminance difference between the odd-numbered row/the even-numbered row generated by the characteristic difference of the driving transistor 22 between the odd-numbered row/the even-numbered row and the coupling difference depending on the shape of the pixel structure. As a result, it is possible to improve the partial deterioration of the uniformity that cannot be handled with the function of correction performed in units of pixels.

Therefore, adopting the configuration in which the wiring or the like for driving the pixel 20 is shared between the odd-numbered row and the even-numbered row, and the pixel structure of the odd-numbered row and the pixel structure of the even-numbered row are each a mirror-inverted structure does not result in deterioration of the uniformity, such as horizontal stripes. As a result, by sharing the wiring or the like for driving the pixel 20 between the odd-numbered row and the even-numbered row, it is possible to compress the space of the display area, which contributes to high definition.

Example 2

Figure 6:
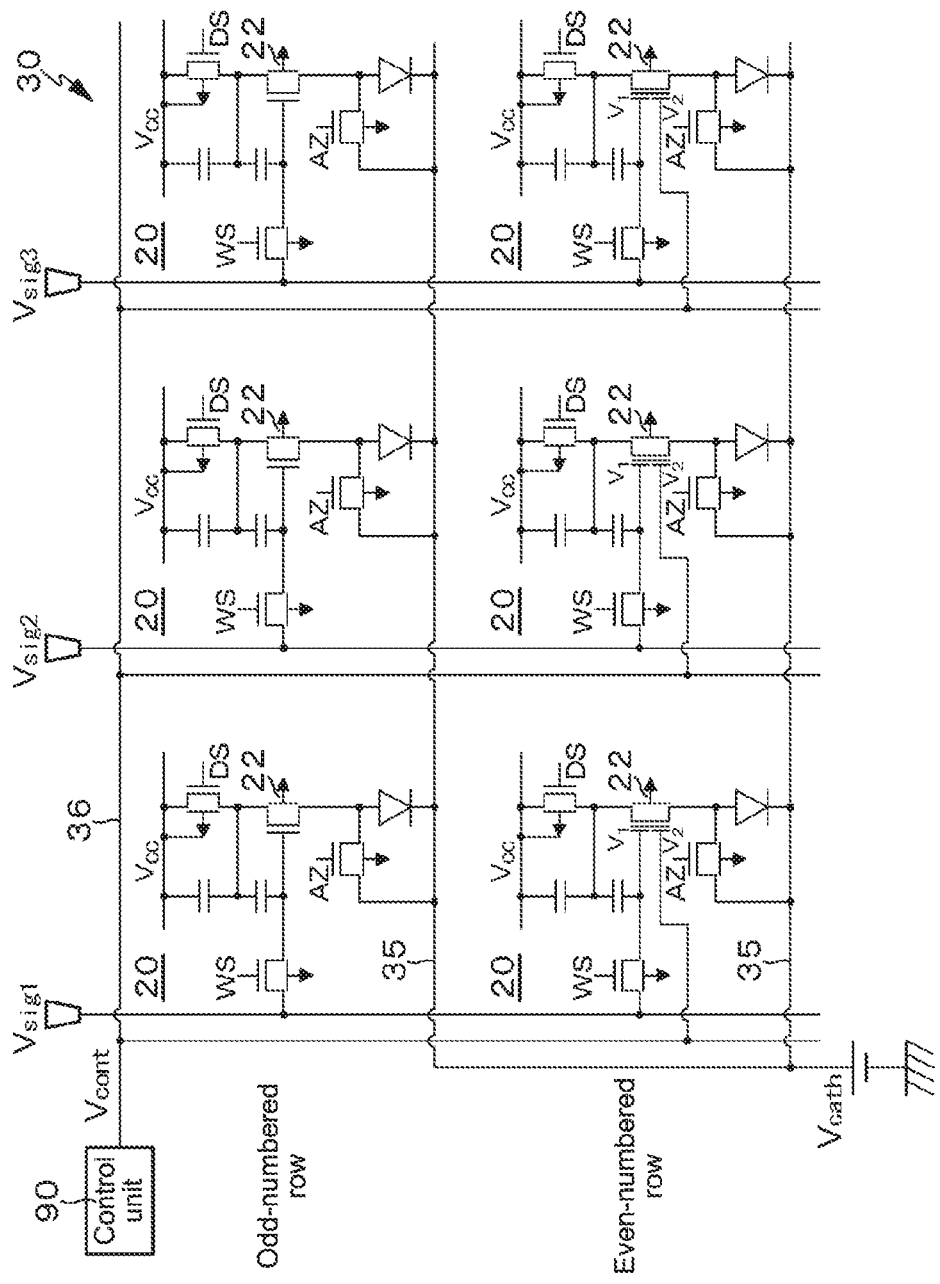
FIG. 6 is a circuit diagram showing a circuit configuration of a main portion of an organic EL display apparatus according to an example 2.

An example 2 is a modified example of the example 1. A circuit diagram of a circuit configuration of a main portion of an organic EL display apparatus according to the example 2 is shown in FIG. 6. In the example 1, a configuration in which luminance adjustment is collectively performed for the odd-numbered rows is adopted. Meanwhile, in the example 2, a configuration in which luminance adjustment is collectively performed for the even-numbered rows is adopted.

In the example 2, in the pixel arrangement of the pixel array unit 30, the driving transistor 22 of the pixel 20 in the even-numbered row includes, for example, a transistor having a neuron MOS structure in which two gate electrodes are provided. The driving transistor 22 of the pixel 20 in the odd-numbered row includes a P-channel transistor having a single gate structure.

In the pixel 20 in the even-numbered row, the signal voltage $V_{sig}$ of a video signal is applied, as the gate voltage $V_1$, to one gate electrode of the driving transistor 22 including a neuron MOS. Further, the control voltage $V_{cont}$ as predetermined direct current voltage is applied, as the gate voltage $V_2$, from the control unit 90 to the different gate electrode of the driving transistor 22 via the control line 36. The control line 36 is commonly wired between the control unit 90 and the pixels 20 in the even-numbered rows.

The control unit 90 supplies, as the control voltage $V_{cont}$, direct current voltage of such a voltage value that eliminates the luminance difference that occurs between the odd-numbered row/the even-numbered row to the different gate electrode of the driving transistor 22 of the pixel 20 in the even-numbered row due to the characteristic difference of the driving transistor 22 between the odd-numbered row/the even-numbered row and the coupling difference depending on the shape of the pixel structure. The voltage value of the control voltage $V_{cont}$ is set to such a value that makes the luminance difference between the odd-numbered row/the even-numbered row small, favorably, zero, similarly to the example 1.

According to the example 2 having the above-mentioned configuration, it is possible to achieve the same operation and effect as those of the example 1. That is, it is possible to prevent horizontal stripes from occurring due to the luminance difference between the odd-numbered row/the even-numbered row generated by the characteristic difference of the driving transistor 22 between the odd-numbered row/the even-numbered row and the coupling difference depending on the shape of the pixel structure, and improve the partial deterioration of the uniformity that cannot be handled with the function of correction performed in units of pixels.

Example 3

Figure 7:
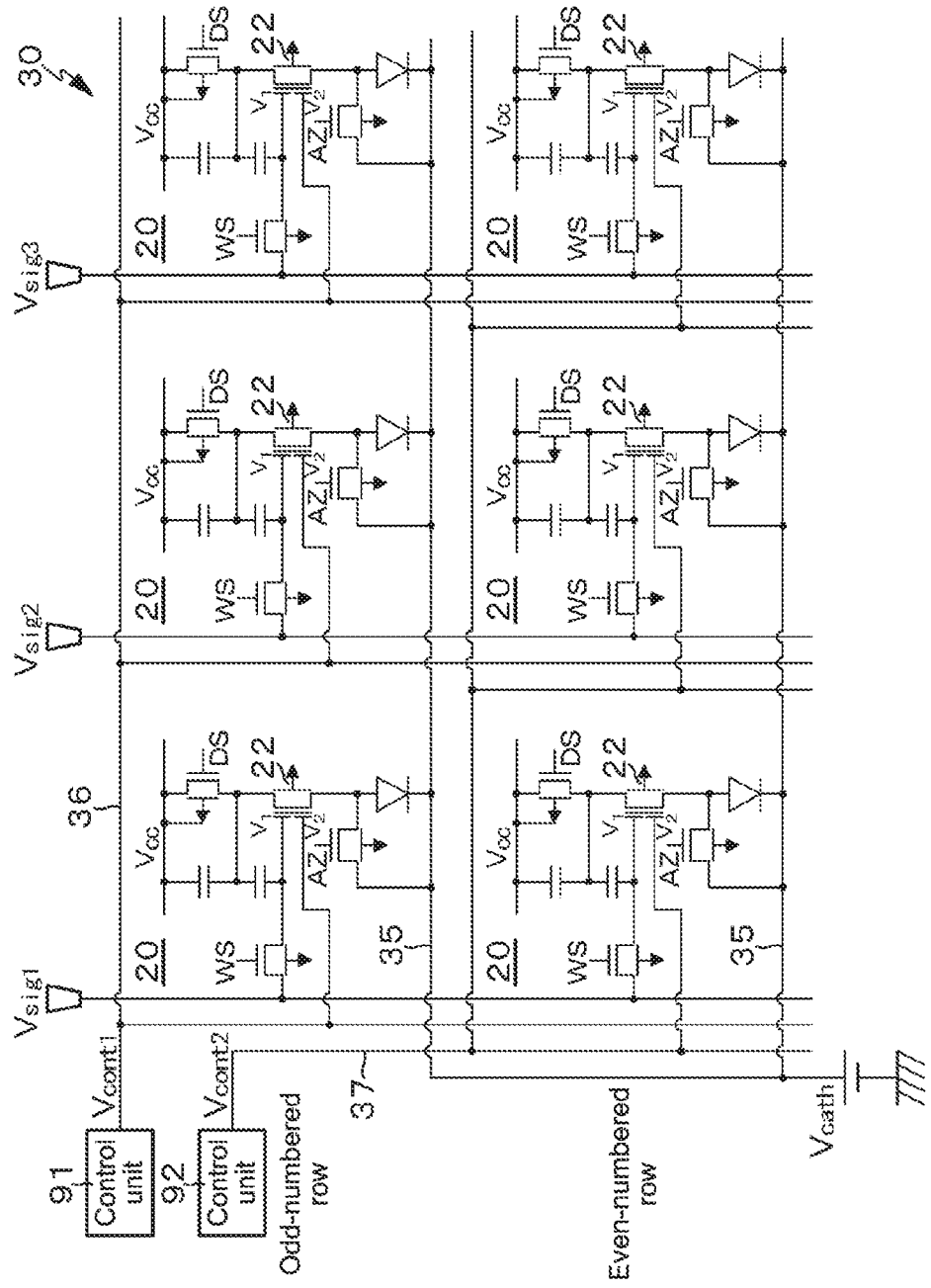
FIG. 7 is a circuit diagram showing a circuit configuration of a main portion of an organic EL display apparatus according to an example 3.

An example 3 is a modified example of the example 1/the example 2. A circuit diagram of a circuit configuration of a main portion of an organic EL display apparatus according to the example 3 is shown in FIG. 7. In the example 1, a configuration in which luminance adjustment is collectively performed for the odd-numbered rows is adopted. In the example 2, a configuration in which luminance adjustment is collectively performed for the even-numbered rows is adopted. Meanwhile, in the example 3, a configuration in which luminance adjustment is collectively performed for both of the odd-numbered rows/even-numbered rows is adopted.

In the example 3, in the pixel arrangement of the pixel array unit 30, as each of the driving transistors 22 of all the pixels 20, for example, a transistor having a neuron MOS structure in which two gate electrodes are provided is used. In the pixel arrangement in which the driving transistor 22 includes a neuron MOS, control voltage $V_{cont1}$ is applied, as the gate voltage $V_2$, from a control unit 91 to the different electrode of the driving transistor 22 in the odd-numbered row via the control line 36. Further, control voltage $V_{cont2}$ is applied, as the gate voltage $V_2$, from a control unit 92 to the different gate electrode of the driving transistor 22 in the even-numbered row via a control line 37.

Each voltage value of the control voltage $V_{cont1}$ and the control voltage $V_{cont2}$ is set to such a value that makes the luminance difference between the odd-numbered row/the even-numbered row small, favorably, zero, considering the characteristic difference of the driving transistor 22 between the odd-numbered row/the even-numbered row and the coupling difference depending on the shape of the pixel structure for each organic EL display apparatus 10.

According to also the example 3 having the above-mentioned configuration, it is possible to achieve the same operation and effect as those of the example 1/the example 2. That is, it is possible to prevent horizontal stripes from occurring due to the luminance difference between the odd-numbered row/the even-numbered row generated by the characteristic difference of the driving transistor 22 between the odd-numbered row/the even-numbered row and the coupling difference depending on the shape of the pixel structure, and improve the partial deterioration of the uniformity that cannot be handled with the function of correction performed in units of pixels. Further, according to the example 3, since the threshold voltage $V_{th}$ of the driving transistor 22 can be adjusted in both of the odd-numbered row/even-numbered row, it is possible to enlarge the adjustment range of the luminance in both of the odd-numbered row/even-numbered row.

Example 4

Figure 8:
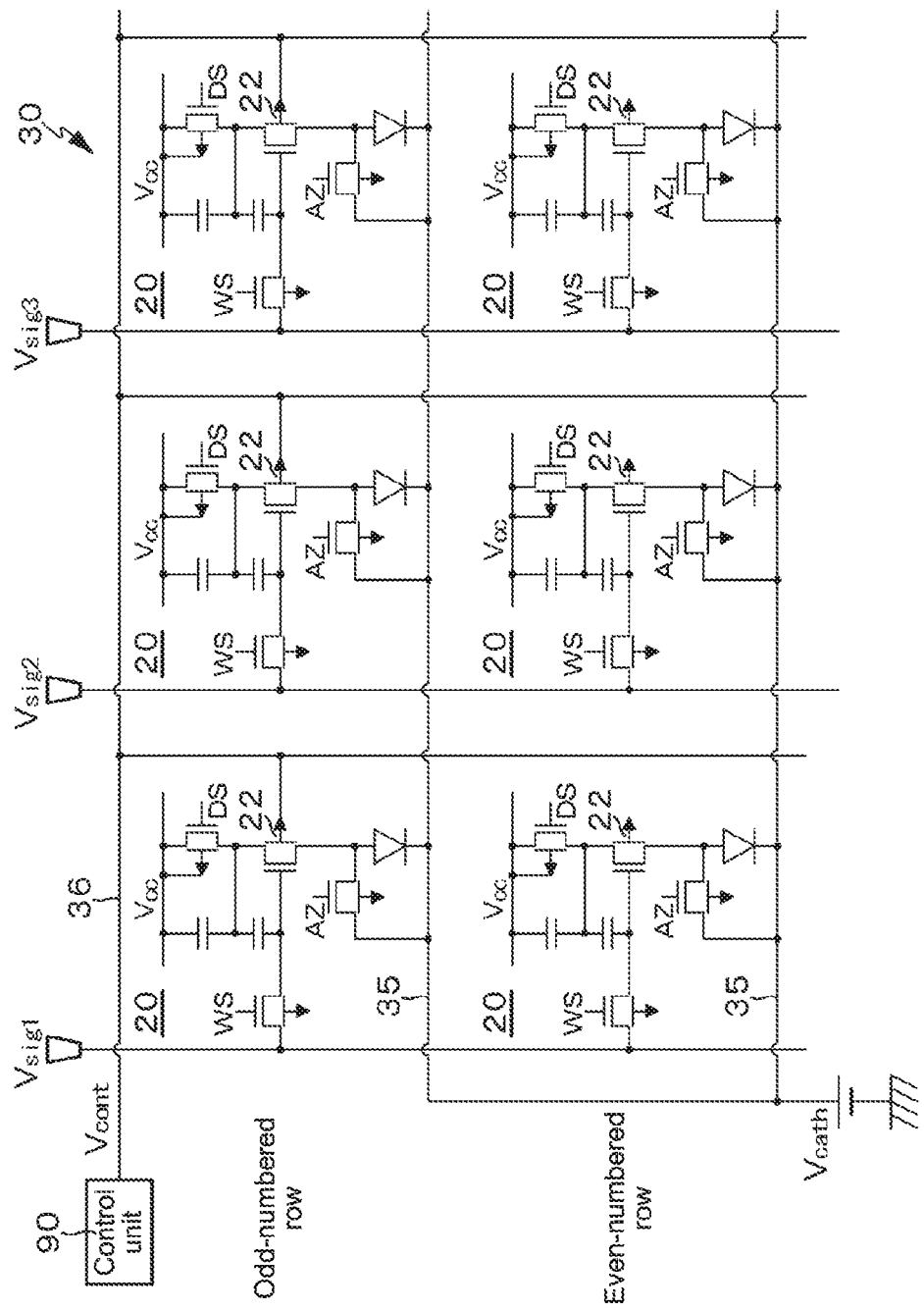
FIG. 8 is a circuit diagram showing a circuit configuration of a main portion of an organic EL display apparatus according to an example 4.

An example 4 is a modified example of the example 1. A circuit diagram of a circuit configuration of a main portion of an organic EL display apparatus according to the example 4 is shown in FIG. 8. The example 1 is an example in which the transistor having a neuron MOS structure is used as the driving transistor 22, the signal voltage $V_{sig}$ of a video signal is applied to the one gate electrode, and the gate voltage $V_2$ of the different gate electrode is controlled.

Meanwhile, the example 4 is an example in which voltage of a back gate is controlled in the driving transistor 22 that includes a transistor having a structure including the back gate. Specifically, in the pixel 20 in the odd-numbered row, the control voltage $V_{cont}$ as predetermined direct current voltage is applied, as back gate voltage, from the control unit 90 to a back gate of the driving transistor 22 having a structure including the back gate via the control line 36. The control line 36 is commonly wired between the control unit 90 and the pixels 20 in the odd-numbered rows.

The control unit 90 supplies, as the control voltage $V_{cont}$, direct current voltage of such a voltage value that eliminates the luminance difference that occurs between the odd-numbered row/the even-numbered row to the back gate of the driving transistor 22 of the pixel 20 in the odd-numbered row, similarly to the case of the example 1. The voltage value of the control voltage $V_{cont}$ is set to such a value that makes the luminance difference between the odd-numbered row/the even-numbered row small, favorably, zero, considering the characteristic difference of the driving transistor 22 between the odd-numbered row/the even-numbered row and the coupling difference depending on the shape of the pixel structure for each organic EL display apparatus 10.

According to also the example 4 having the above-mentioned configuration, it is possible to achieve the same operation and effect as those of the example 1. That is, it is possible to prevent horizontal stripes from occurring due to the luminance difference between the odd-numbered row/the even-numbered row generated by the characteristic difference of the driving transistor 22 between the odd-numbered row/the even-numbered row and the coupling difference depending on the shape of the pixel structure, and improve the partial deterioration of the uniformity that cannot be handled with the function of correction performed in units of pixels.

In the example 4 in which luminance adjustment is collectively performed for the odd-numbered rows, as a modified example thereof, it is possible to adopt a configuration in which luminance adjustment is collectively performed for the even-numbered rows similarly to the example 2 or a configuration in which luminance adjustment is collectively performed for both of the odd-numbered rows/even-numbered rows similarly to the example 3.

Example 5

Figure 9:
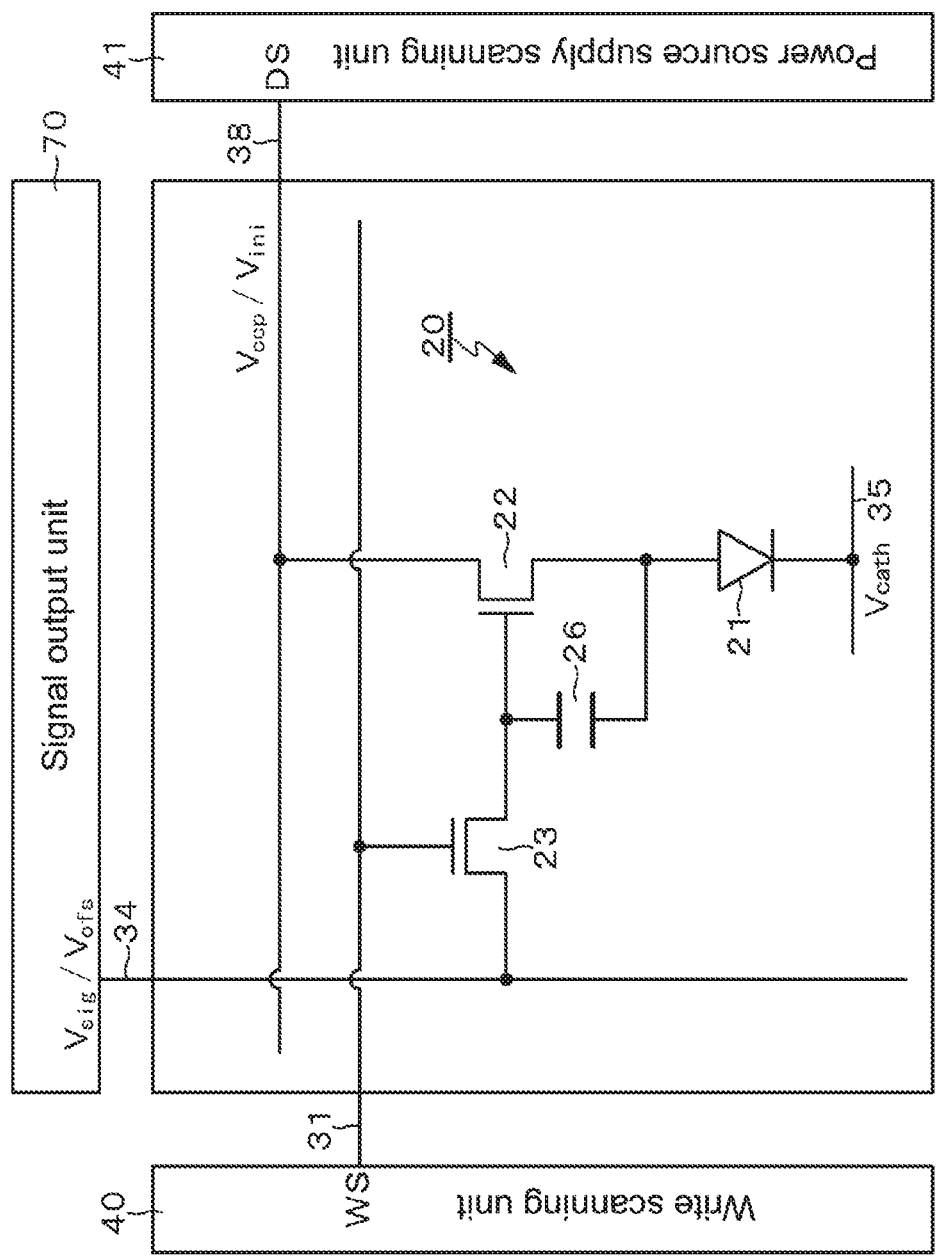
FIG. 9 is a circuit diagram showing a circuit example of a pixel in an active matrix display apparatus to which an example 5 is applied.

An example 5 is a modified example of the example 1. A circuit example of a pixel in an active matrix display apparatus to which the example 5 is applied is shown in FIG. 9. Also in this example, an active matrix organic EL display apparatus using an organic EL device as a light emitting unit (light emitting device) of a pixel circuit will be described as an example.

As shown in FIG. 9, the pixel 20 includes the organic EL device 21, and a driving circuit that drives the organic EL device 21 by applying current to the organic EL device 21. The driving circuit of the organic EL device 21 includes the driving transistor 22, the write transistor 23, and the holding capacitance 26.

As each of the driving transistor 22 and the write transistor 23, an N-channel TFT can be used. Note that the combination of conductive types of the driving transistor 22 and the write transistor 23 shown herein is only an example, and is not limited thereto. Here, assumption is made that the organic EL device 21, the driving transistor 22, and the holding capacitance 26 are formed on an insulator such as a glass substrate, as an example.

In the driving transistor 22, one electrode (source/drain electrode) is connected to the anode electrode of the organic EL device 21, and a different electrode (source/drain electrode) is connected to the power source supply line 38. Here, the one electrode represents a metal wiring electrically connected to one source/drain area, and the different electrode represents a metal wiring electrically connected to a different source/drain area. Further, depending on the potential relationship between the one electrode and the different electrode, the one electrode is a source electrode or a drain electrode in some cases, and the different electrode is a drain electrode or a source electrode in some cases.

A power source potential DS that can be switched between a first power source potential $V_{ccp}$ and a second power source potential $V_{ini}$ that is lower than the first power source potential $V_{ccp}$ is supplied from a power source supply scanning unit 41 to the power source supply line 38 to which the different electrode of the driving transistor 22 is connected, in synchronization with the line sequential scanning by the write scanning unit 40. By switching this power source potential DS, light emission/non-light emission (turning-off) of the pixel 20 is controlled.

Note that although the circuit configuration of 2Tr1C including two transistors (Tr) of the driving transistor 22 and the write transistor 23, and one capacitive device (C) of the holding capacitance 26 has been illustrated here the driving circuit of the organic EL device 21, the driving circuit is not limited thereto.

In the organic EL display apparatus having the above-mentioned configuration, the example 5 is an example in which a dual gate TFT is used as the driving transistor 22 and one of a dual gate is controlled.

Figure 10:
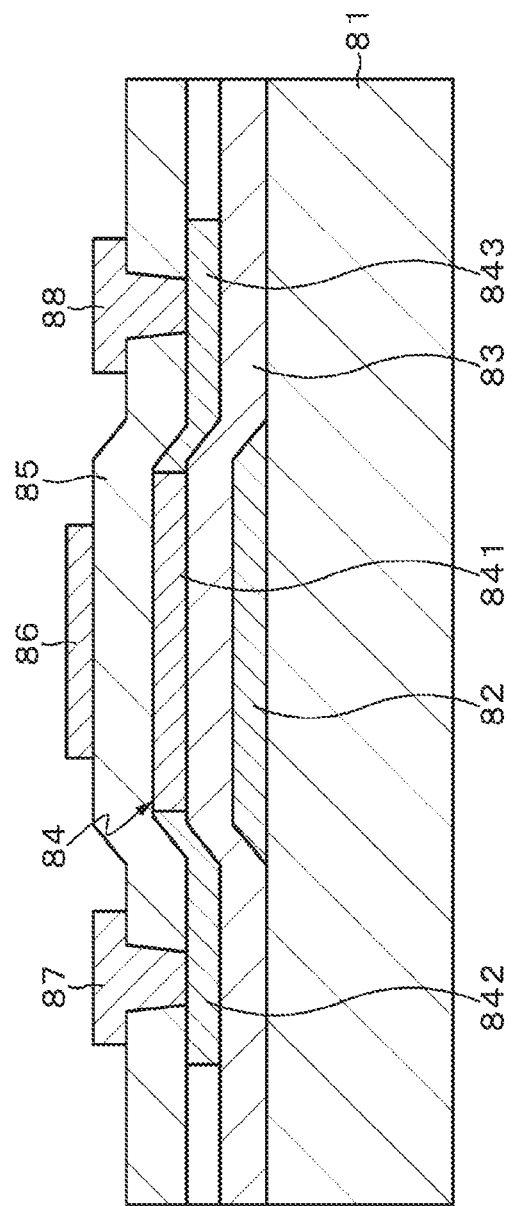
FIG. 10 is a cross-sectional view showing an example of a cross-sectional structure of a dual gate TFT.

An example of a cross-sectional structure of a dual gate TFT used as the driving transistor 22 is shown in FIG. 10. The dual gate TFT includes, for example, a lower gate electrode 82, a first gate insulating film 83, a semiconductor layer 84, a second gate insulating film 85, and an upper gate electrode 86 on a substrate 81 in the stated order. Further, an area sandwiched between the lower gate electrode 82 and the upper gate electrode 86 in the semiconductor layer 84 is a channel area 841, and areas of both ends thereof are a source area 842 and a drain area 843. A source electrode 87 is electrically connected to the source area 842, and a drain electrode 88 is electrically connected to the drain area 843.

The example 5 is an example in which voltage of one gate electrode (e.g., the lower gate electrode 82) of the driving transistor 22 including the dual gate TFT is controlled. A circuit configuration of a main portion of an organic EL display apparatus according to the example 5 is shown in FIG. 11.

Figure 11:
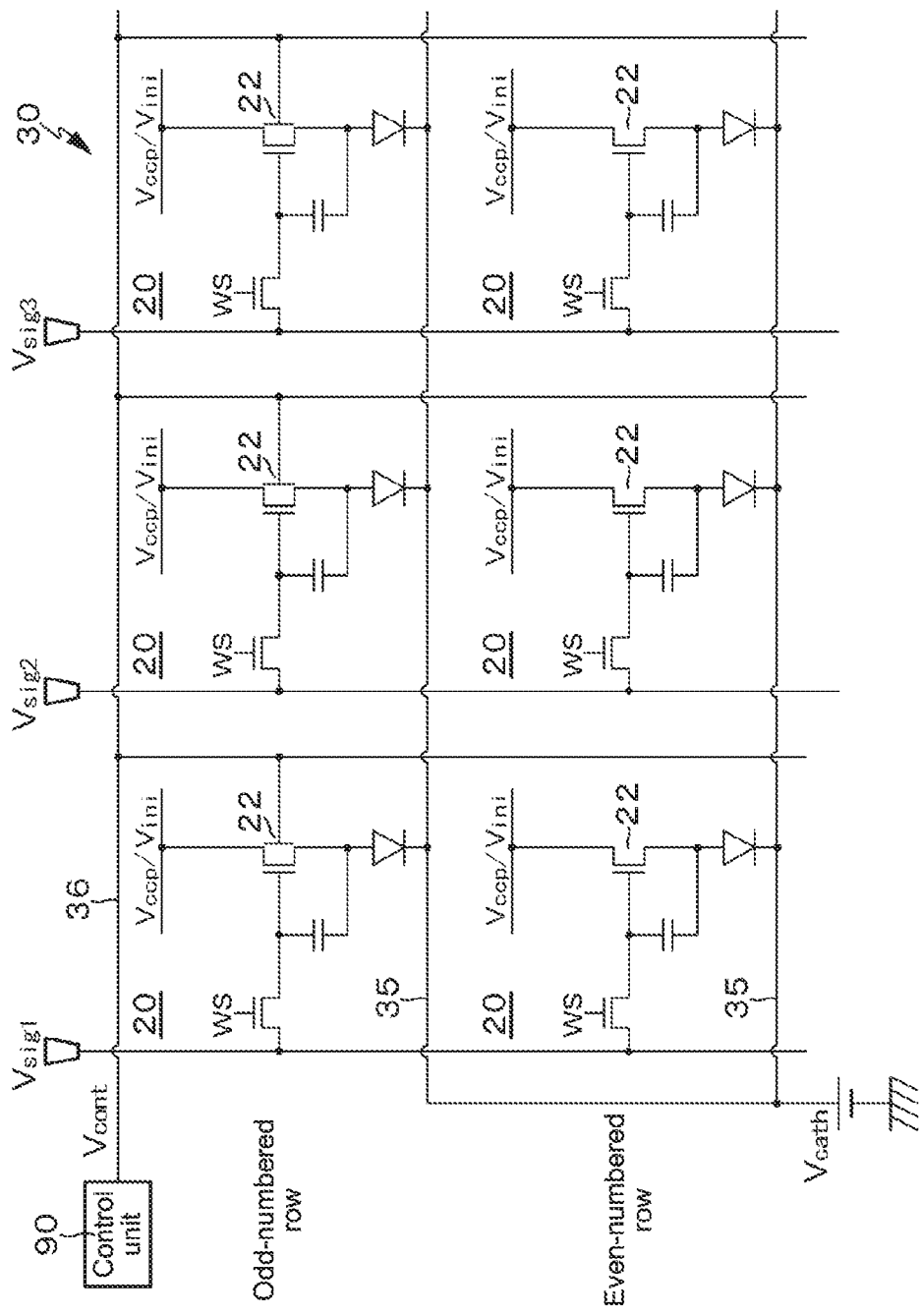
FIG. 11 is a circuit diagram showing a circuit configuration of a main portion of an organic EL display apparatus according to an example 5.

As shown in FIG. 11, in the pixel 20 in the odd-numbered row, the control voltage $V_{cont}$ as predetermined direct current voltage is applied, as gate voltage, from the control unit 90 to one gate electrode of the driving transistor 22 including the dual gate TFT via the control line 36. The control line 36 is commonly wired between the control unit 90 and the pixel 20 in each odd-numbered row. The driving transistor 22 of the pixel 20 in the even-numbered row includes a normal N-channel TFT.

The control unit 90 supplies, as the control voltage $V_{cont}$, direct current voltage of such a voltage value that eliminates the luminance difference that occurs between the odd-numbered row/the even-numbered row to the different gate electrode of the driving transistor 22, which includes the dual gate TFT, of the pixel 20 in the odd-numbered row, similarly to the case of the example 1. The voltage value of the control voltage $V_{cont}$ is set to such a value that makes the luminance difference between the odd-numbered row/the even-numbered row small, favorably, zero, considering the characteristic difference of the driving transistor 22 between the odd-numbered row/the even-numbered row and the coupling difference depending on the shape of the pixel structure for each organic EL display apparatus 10.

According to also the example 5 having the above-mentioned configuration, it is possible to achieve the same operation and effect as those of the example 1. That is, it is possible to prevent horizontal stripes from occurring due to the luminance difference between the odd-numbered row/the even-numbered row generated by the characteristic difference of the driving transistor 22 between the odd-numbered row/the even-numbered row and the coupling difference depending on the shape of the pixel structure, and improve the partial deterioration of the uniformity that cannot be handled with the function of correction performed in units of pixels.

In the example 5 in which luminance adjustment is collectively performed for the odd-numbered rows, as a modified example thereof, it is possible to adopt a configuration in which luminance adjustment is collectively performed for the even-numbered rows similarly to the example 2 or a configuration in which luminance adjustment is collectively performed for both of the odd-numbered rows/even-numbered rows similarly to the example 3.

Modified Example

The technology of the present disclosure is not limited to the above-mentioned embodiment, and various modifications and can be made without departing from the essence of the present disclosure. For example, in the example 1 to the example 4, a case where the technology of the present disclosure is applied to a display apparatus in which the device constituting the pixel 20 is formed on a semiconductor substrate such as a silicon single crystalline substrate has been described as an example. However, the present technology of the present disclosure can be similarly applied also to a display apparatus in which the device constituting the pixel 20 is formed on an insulator such as a glass substrate.

<Electronic Apparatus>

The above-mentioned display apparatus according to the present disclosure can be used as a display unit (display apparatus) of an electronic apparatus in every field in which a video signal input to the electronic apparatus or a video signal generated in the electronic apparatus is displayed as an image or video. Examples of the electronic apparatus include a television set, a laptop personal computer, a digital still camera, a portable terminal apparatus such as a mobile phone, and a head mounted display. However, the electronic apparatus is not limited thereto.

By using the display apparatus according to the present disclosure as a display unit of an electronic apparatus in every field as described above, the following effects can be achieved. That is, according to the display apparatus of the present disclosure, since the partial deterioration of the uniformity that cannot be handled with the function of correction performed in units of pixels, such as horizontal stripes that occur due to the luminance difference between the odd-numbered row/the even-numbered row, can be improved, it is possible to improve the image quality of the display unit. In addition, since it is possible to prevent horizontal stripes due to the luminance difference between the odd-numbered row/the even-numbered row from occurring, the wiring or the like for driving the pixel between the odd-numbered row and the even-numbered row can be shared and the space of the display area can be compressed, thereby realizing the high definition of the display unit.

The display apparatus of the present disclosure includes a module-shaped display apparatus having a sealed configuration. By way of example, a display module that is formed by attaching a facing portion formed of transparent glass or the like to a pixel array unit corresponds to the display apparatus. Note that the display module may include a circuit unit for inputting/outputting signals or the like from the outside to the pixel array unit, a flexible printed circuit (FPC), or the like. Hereinafter, a digital still camera and a head mounted display are exemplified as specific examples of the electronic apparatus using the display apparatus of the present disclosure. It should be noted that the specific examples described herein are merely illustrative, and the present disclosure is not limited thereto.

Specific Example 1

FIG. 12 is an outer appearance view of a digital still camera of a lens-interchangeable and single-lens-reflex type, in which FIG. 12A shows a front view thereof and FIG. 12B shows a rear view thereof. The digital still camera of a lens-interchangeable and single-lens-reflex type includes, for example, an interchangeable imaging lens unit (interchangeable lens) 112 on the right side of the front of a camera main body portion (camera body) 111, and a grip portion 113 to be gripped by a photographer on the left side of the front thereof.

Further, a monitor 114 is provided at substantially the center of the back of the camera main body portion 111. An electronic viewfinder (eyepiece window) 115 is provided above the monitor 114. A photographer can visually recognize an optical image of a subject, which is derived from the imaging lens unit 112, and then determine the composition by looking through the electronic viewfinder 115.

In the digital still camera of a lens-interchangeable and single-lens-reflex type having the configuration described above, the display apparatus of the present disclosure can be used as the electronic viewfinder 115 of the digital still camera. In other words, the digital still camera of a lens-interchangeable and single-lens-reflex type according to this example is produced by using the display apparatus of the present disclosure as the electronic viewfinder 115 of the digital still camera.

Specific Example 2

Figure 13:
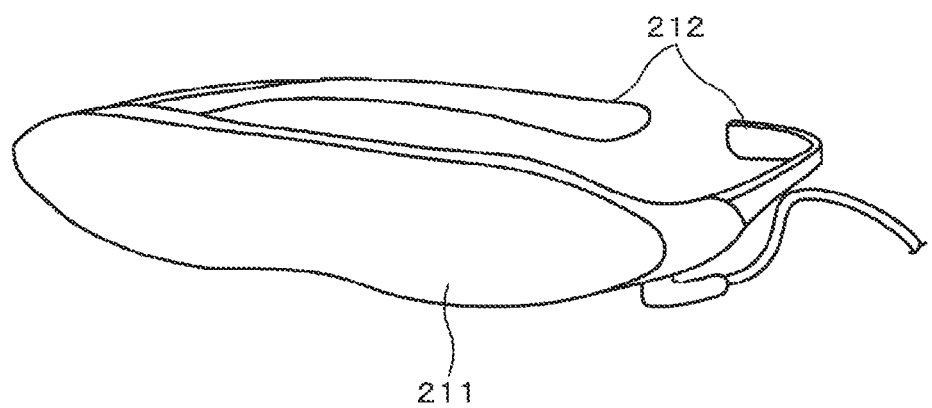
FIG. 13 is an outer appearance view of a head mounted display.

FIG. 13 is an outer appearance view of a head mounted display. The head mounted display includes, for example, temple portions 212 on the both sides of an eyeglass-shaped display unit 211. The temple portions 412 are used to be mounted to the head of a user. In this head mounted display, the display apparatus of the present disclosure can be used as the display unit 211 of the head mounted display. In other words, the head mounted display according to this example is produced by using the display apparatus of the present disclosure as the display unit 211 of the head mounted display.

<Configuration of Present Disclosure>

It should be noted that the present technology may take the following configurations.

[1] A display apparatus, including:
a pixel array unit, pixels being arranged in the pixel unit, the pixels each including a driving transistor that includes a plurality of gate electrodes and drives a light emitting unit in response to a video signal applied to one gate electrode of the plurality of gate electrodes; and
a control unit that controls gate voltage of a different gate electrode of the driving transistor.

[2] The display apparatus according to [1] above, in which the control unit corrects threshold voltage of the driving transistor by controlling the gate voltage of the different gate electrode.

[3] The display apparatus according to [1] or [2] above, in which
the control unit applies predetermined direct current voltage to the different gate electrode as control voltage.

[4] The display apparatus according to any one of [1] to [3] above, in which
the different gate electrode is a back gate.

[5] The display apparatus according to any one of [1] to [3] above, in which
the different gate electrode is one of gate electrodes of a dual-gate structure.

[6] The display apparatus according to any one of [1] to [5] above, in which
the control unit controls the gate voltage of the different gate electrode in units of pixel rows of the pixel array unit.

[7] The display apparatus according to [6] above, in which the pixels each including the driving transistor that includes the plurality of gate electrodes are arranged in even-numbered pixel rows, odd-numbered pixel rows, or all the pixel rows of the pixel array unit, and
the control unit controls the gate voltage of the different gate electrode in only the even-numbered pixel rows or the odd-numbered rows, or in the all pixel rows.

[8] The display apparatus according to any one of [1] to [7] above, in which
the pixels each have a threshold voltage correction function of using, as a reference, initialization voltage of the gate electrode, to which the video signal is applied, of the driving transistor, and changing source voltage of the driving transistor toward voltage obtained by subtracting the threshold voltage of the driving transistor from the initialization voltage.

[9] The display apparatus according to any one of [1] to [8] above, in which
the light emitting unit includes an organic electroluminescence device.

[10] An electronic apparatus, including:
a display apparatus including
a pixel array unit, pixels being arranged in the pixel unit, the pixels each including a driving transistor that includes a plurality of gate electrodes and drives a light emitting unit in response to a video signal applied to one gate electrode of the plurality of gate electrodes, and
a control unit that controls gate voltage of a different gate electrode of the driving transistor.

REFERENCE SIGNS LIST 10 organic EL display apparatus
20 pixel
21 organic EL device
22 driving transistor
23 write transistor
24 light emission control transistor
25 switching transistor
26 holding capacitance
27 auxiliary capacitance
30 pixel array unit
31 ($31_1$ to $31_m$) scanning line
32 ($32_1$ to $32_m$) first driving line
33 ($33_1$ to $33_m$) second driving line
34 ($34_1$ to $34_n$) signal line
35 cathode wiring
36, 37 control line
38 power source supply line
40 write scanning unit
41 power source supply scanning unit
50 first drive scanning unit
60 second drive scanning unit
70 signal output unit
80 display panel
90, 91, 92 control unit

The invention claimed is:

1. A display apparatus, comprising:
a plurality of pixels,
wherein each of the plurality of pixels includes a light emitting element, a capacitor, a write transistor configured to supply signal voltage supplied through a data signal line to the capacitor, and a driving transistor configured to supply a driving current from a first voltage source to the light emitting element according to a first voltage stored in the capacitor, the light emitting element and the driving transistor are electrically connected serially between the first voltage source and a second voltage source;
a conductive layer arranged below a first channel region of the driving transistor of at least one of the plurality of pixels; and
a control circuitry configured to control the at least one of the plurality of pixels such that a second voltage between the conductive layer and the second voltage source is changed to perform an adjustment of luminance of the light emitting element,
wherein the conductive layer is not arranged below a second channel region of the write transistor.

2. The display apparatus according to claim 1, wherein the first voltage source is electrically connected to a first terminal of the driving transistor, and
the second voltage source is electrically connected to a cathode electrode of the light emitting element.

3. The display apparatus according to claim 1, wherein the adjustment of luminance occurs at least during a period when the light emitting element of the at least one of the plurality of pixels emits light.

4. The display apparatus according to claim 1, wherein the control circuitry is further configured to apply a predetermined direct current voltage to the conductive layer such that the voltage between the conductive layer and the second voltage source is changed to perform the adjustment of luminance.

5. The display apparatus according to claim 1, wherein the at least one of the plurality of pixels has a threshold voltage correction function of using, as a reference, an initialization voltage of a gate electrode, to which the signal voltage is applied, of the driving transistor of the at least one of the plurality of pixels, and changing a source voltage of the driving transistor of the at least one of the plurality of pixels toward a second voltage obtained by subtracting a threshold voltage of the driving transistor from the initialization voltage.

6. The display apparatus according to claim 1, wherein the light emitting element includes an organic electroluminescence device.

7. The display apparatus according to claim 1, wherein the driving transistor of the at least one of the plurality of pixels includes a semiconductor layer,
a gate electrode of the driving transistor of the at least one of the plurality of pixels is disposed above the semiconductor layer, and
the conductive layer is disposed below the semiconductor layer.

8. The display apparatus according to claim 1, wherein the control circuitry is further configured to control the at least one of the plurality of pixels such that a potential of the conductive layer is changed to perform the adjustment of luminance.

9. The display apparatus according to claim 1, wherein a first gate electrode of the driving transistor of the at least one of the plurality of pixels is electrically connected to the capacitor, and
the conductive layer is a second gate electrode of the driving transistor of the at least one of the plurality of pixels.

10. The display apparatus according to claim 9, wherein the first gate electrode and the second gate electrode are part of a dual-gate structure.

11. An electronic apparatus comprising:
a display apparatus including
a plurality of pixels,
wherein each of the plurality of pixels includes a light emitting element, a capacitor, a write transistor configured to supply a signal voltage supplied through a data signal line to the capacitor, and a driving transistor configured to supply a driving current from a first voltage source to the light emitting element according to a first voltage stored in the capacitor,
the light emitting element and the driving transistor are electrically connected serially between the first voltage source and a second voltage source;
a conductive layer arranged below a first channel region of the driving transistor of at least one of the plurality of pixels; and
a control circuitry configured to control the at least one of the plurality of pixels such that a second voltage between the conductive layer and the second voltage source is changed to perform an adjustment of luminance of the light emitting element,
wherein the conductive layer is not arranged below a second channel region of the write transistor.

12. The electronic apparatus according to claim 11, wherein
the first voltage source is electrically connected to a first terminal of the driving transistor, and
the second voltage source is electrically connected to a cathode electrode of the light emitting element.

13. The electronic apparatus according to claim 11, wherein the adjustment of luminance occurs at least during a period when the light emitting element of the at least one of the plurality of pixels emits light.

14. The electronic apparatus according to claim 11, wherein the control circuitry is further configured to apply a predetermined direct current voltage to the conductive layer such that the voltage between the conductive layer and the second voltage source is changed to perform the adjustment of luminance.

15. The electronic apparatus according to claim 11, wherein the at least one of the plurality of pixels has a threshold voltage correction function of using, as a reference, an initialization voltage of a gate electrode, to which the signal voltage is applied, of the driving transistor of the at least one of the plurality of pixels, and changing a source voltage of the driving transistor of the at least one of the plurality of pixels toward a second voltage obtained by subtracting a threshold voltage of the driving transistor from the initialization voltage.

16. The electronic apparatus according to claim 11, wherein the light emitting element includes an organic electroluminescence device.

17. The electronic apparatus according to claim 11, wherein
the driving transistor of the at least one of the plurality of pixels includes a semiconductor layer,
a gate electrode of the driving transistor of the at least one of the plurality of pixels is disposed above the semiconductor layer, and
the conductive layer is disposed below the semiconductor layer.

18. The electronic apparatus according to claim 11, wherein the control circuitry is further configured to control the at least one of the plurality of pixels such that a potential of the conductive layer is changed to perform the adjustment of luminance.

19. The electronic apparatus according to claim 11, wherein
    a first gate electrode of the driving transistor of the at least one of the plurality of pixels is electrically connected to the capacitor, and
    the conductive layer is a second gate electrode of the driving transistor of the at least one of the plurality of pixels.

20. The electronic apparatus according to claim 19, wherein the first gate electrode and the second gate electrode are part of a dual-gate structure.

* * * * *